(12) United States Patent
Moriguchi et al.

(10) Patent No.: US 9,190,526 B2
(45) Date of Patent: Nov. 17, 2015

(54) THIN FILM TRANSISTOR, DISPLAY PANEL, AND METHOD FOR FABRICATING THIN FILM TRANSISTOR

(75) Inventors: Masao Moriguchi, Osaka (JP); Yohsuke Kanzaki, Osaka (JP); Yudai Takanishi, Osaka (JP); Takatsugu Kusumi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/111,887

(22) PCT Filed: Apr. 12, 2012

(86) PCT No.: PCT/JP2012/002533
§ 371 (c)(1),
(2), (4) Date: Oct. 23, 2013

(87) PCT Pub. No.: WO2012/144165
PCT Pub. Date: Oct. 26, 2012

(65) Prior Publication Data
US 2014/0034947 A1    Feb. 6, 2014

(30) Foreign Application Priority Data
Apr. 18, 2011  (JP) .................. 2011-092418

(51) Int. Cl.
*H01L 29/10* (2006.01)
*H01L 29/12* (2006.01)
*H01L 21/00* (2006.01)
(Continued)

(52) U.S. Cl.
CPC .......... *H01L 29/7869* (2013.01); *G02F 1/1368* (2013.01); *H01L 29/6675* (2013.01); *H01L 27/1225* (2013.01)

(58) Field of Classification Search
CPC .................. H01L 29/7869; H01L 29/6675
USPC ............................................. 257/43; 438/104
See application file for complete search history.

(56) References Cited

U.S. PATENT DOCUMENTS

2008/0203387 A1   8/2008  Kang et al.
2008/0308805 A1*  12/2008  Akimoto et al. ............. 257/59
(Continued)

FOREIGN PATENT DOCUMENTS

KR   10-2002-0032533 A   5/2002
KR   10-2008-0079906 A   9/2008
(Continued)

OTHER PUBLICATIONS

Official Communication issued in International Patent Application No. PCT/JP2012/002533, mailed on Jun. 12, 2012.

*Primary Examiner* — Matthew Landau
*Assistant Examiner* — Igwe U Anya
(74) *Attorney, Agent, or Firm* — Keating & Bennett, LLP

(57) ABSTRACT

A thin film transistor includes a gate electrode (11a), a gate insulating film (12a) covering the gate electrode (11a), a semiconductor layer (13a) made of an oxide semiconductor and provided on the gate insulating film (12a), a source electrode (16aa) and a drain electrode (16ab) provided on the semiconductor layer (13a) via easily reducible metal layers (15aa, 15ab) and spaced apart from each other, with a channel region (C) interposed therebetween, a conductive region (E) provided in the semiconductor layer (13a), and a diffusion reducing portion (13ca, 13cb) provided in the semiconductor layer (13a), for reducing diffusion of the conductive region (E) into the channel region (C).

15 Claims, 12 Drawing Sheets

(51) Int. Cl.
  *H01L 51/40*   (2006.01)
  *H01L 29/786*  (2006.01)
  *G02F 1/1368*  (2006.01)
  *H01L 29/66*   (2006.01)
  *H01L 27/12*   (2006.01)

(56) References Cited

U.S. PATENT DOCUMENTS

| | | | |
|---|---|---|---|
| 2010/0090217 A1* | 4/2010 | Akimoto | 257/43 |
| 2010/0117078 A1 | 5/2010 | Kuwabara et al. | |
| 2010/0176394 A1 | 7/2010 | Park et al. | |
| 2010/0301328 A1* | 12/2010 | Yamazaki et al. | 257/43 |
| 2010/0326144 A1* | 12/2010 | Foster et al. | 70/58 |
| 2011/0193081 A1* | 8/2011 | Godo et al. | 257/43 |
| 2011/0240998 A1* | 10/2011 | Morosawa et al. | 257/57 |
| 2011/0284836 A1* | 11/2011 | Lee et al. | 257/43 |
| 2012/0001167 A1* | 1/2012 | Morosawa | 257/43 |
| 2012/0305925 A1* | 12/2012 | Misaki | 257/59 |

FOREIGN PATENT DOCUMENTS

| | | |
|---|---|---|
| KR | 10-2010-0054105 A | 5/2010 |
| KR | 10-2010-0094275 A | 8/2010 |
| KR | 10-2010-0127593 A | 12/2010 |

* cited by examiner

THIN FILM TRANSISTOR, DISPLAY PANEL, AND METHOD FOR FABRICATING THIN FILM TRANSISTOR

TECHNICAL FIELD

The present disclosure relates to thin film transistors, display panels, and methods for fabricating the thin film transistors, especially relates to thin film transistors using a semiconductor layer made of an oxide semiconductor, display panels which include the thin film transistor, and methods for fabricating the thin film transistors.

BACKGROUND ART

In recent thin film transistor substrates which comprise liquid crystal display panels, as a switching element for each sub-pixel, which is a minimum unit of an image, a thin film transistor (hereinafter also referred to as a "TFT") using a semiconductor layer made of an oxide semiconductor (hereinafter also referred to as an "oxide semiconductor layer") and having favorable characteristics of high mobility, high reliability, and low off-state current have been proposed as a replacement of a conventional TFT using a semiconductor layer made of amorphous silicon.

For example, Patent Document 1 discloses a TFT which includes a gate electrode provided on a substrate, a gate insulating film provided to cover the gate electrode, an oxide semiconductor layer provided on the gate insulating film so as to overlap the gate electrode, and having a channel region, a source region, and a drain region, a titanium layer provided on the source region and the drain region of the oxide semiconductor layer, a source electrode and a drain electrode which are made of copper and respectively connected to the source region and the drain region of the oxide semiconductor layer, with the titanium layer interposed therebetween, wherein a contact resistance between the oxide semiconductor layer, and the source electrode and the drain electrode, is reduced by the titanium layer disposed between the oxide semiconductor layer, and the source electrode and the drain electrode.

CITATION LIST

Patent Document

Patent Document 1: U.S. Patent Application Publication No. 2010/0176394

SUMMARY OF THE INVENTION

Technical Problem

In the TFTs using the oxide semiconductor layer, if the oxide semiconductor layer and the source electrode and the drain electrode are connected, a relatively high contact resistance is generated between the oxide semiconductor layer, and the source electrode and the drain electrode, and on-state current is easily reduced due to the contact resistance. To avoid this, it is suggested, for example, that a metal layer made of such as titanium, which is more easily reduced than the oxide semiconductor layer, is interposed between the oxide semiconductor layer, and the source electrode and the drain electrode, to take oxygen from the oxide semiconductor layer in contact with the metal layer, and make the contact portions of the oxide semiconductor layer with the source electrode and the drain electrode conductive, as shown in Patent Document 1.

Due to the easily reducible metal layer interposed between the oxide semiconductor layer, and the source electrode and the drain electrode, as described above, a conductive region is formed at the contact portion of the oxide semiconductor layer with the easily reducible metal layer. It is therefore possible to reduce the contact resistance between the oxide semiconductor layer, and the source electrode and the drain electrode. However, the entire oxide semiconductor layer may become conductive by a succeeding heat treatment, which causes the conductive region to diffuse in the oxide semiconductor layer. If this happens, the source electrode and the drain electrode are short-circuited, which leads to a malfunction of the TFTs for the sub-pixels, as switching elements.

The present disclosure is therefore intended to reduce a contact resistance between a semiconductor layer made of an oxide semiconductor, and a source electrode and a drain electrode, and reduce short circuits of the source electrode and the drain electrode.

Solution to the Problem

To achieve the above objectives, in the present disclosure, a semiconductor layer is provided with a conductive region that is in contact with an easily reducible metal layer, and a diffusion reducing portion for reducing diffusion of the conductive region into a channel region.

Specifically, a thin film transistor of the present disclosure includes: a gate electrode provided on a substrate; a gate insulating film covering the gate electrode; a semiconductor layer made of an oxide semiconductor provided on the gate insulating film, and having a channel region overlapping the gate electrode; a source electrode and a drain electrode provided on the semiconductor layer via metal layers which are more easily reduced than the semiconductor layer, and spaced apart from each other, with the channel region interposed therebetween; a conductive region provided on the semiconductor layer, and reduced by contact with the metal layers; and a diffusion reducing portion provided in the semiconductor layer, for reducing diffusion of the conductive region into the channel region.

According to the above configuration, metal layers which are more easily reduced than the semiconductor layer are provided between the semiconductor layer made of an oxide semiconductor, and the source electrode and the drain electrode. Further, a conductive region reduced by contact with the metal layers is formed in the semiconductor layer. Thus, a contact resistance between the semiconductor layer, and the source electrode and the drain electrode is small. Moreover, since a diffusion reducing portion for reducing diffusion of the conductive region into the channel region is provided in the semiconductor layer, conduction of the channel region of the semiconductor layer is reduced, and thus, short circuits of the source electrode and the drain electrode are reduced. Due to the conductive region and the diffusion reducing portion formed in the semiconductor layer, a contact resistance between the semiconductor layer made of an oxide semiconductor, and the source electrode and the drain electrode, can be reduced, and short circuits of the source electrode and the drain electrode can be reduced.

The diffusion reducing portion may be configured to reduce a contact area between the semiconductor layer and the metal layers.

According to the above configuration, the diffusion reducing portion is configured to reduce the contact area between the semiconductor layer and the metal layers. Thus, an unnecessary oxidation-reduction reaction at the interface between the semiconductor layer and the metal layers is reduced. In this configuration, excessive formation of the conductive region in the semiconductor layer is reduced, and thus, for example, even if the substrate is heated in a succeeding annealing step to improve the properties of the semiconductor layer, diffusion of the conductive region into the channel region of the semiconductor layer can be reduced.

The metal layers may be provided on the semiconductor layer so as to be opposite to the substrate, the semiconductor layer may be provided with a first opening and a second opening which expose the gate insulating film from the semiconductor layer and each of which serves as the diffusion reducing portion, and the metal layers may be in contact with the semiconductor layer via side walls of the first opening and the second opening. Here, the side wall of each of the first opening and the second opening may be tilted such that a portion closer to the gate insulating film protrudes.

According to the above configuration, the diffusion reducing portion is the first opening and the second opening formed in the semiconductor layer, and the metal layers are in contact with the semiconductor layer not via the bottom but via the side wall of each of the first opening and the second opening. Thus, the contact area between the semiconductor layer and the metal layers is specifically reduced. Further, if the side wall of each of the first opening and the second opening is tilted in a tapered shape such that a portion closer to the gate insulating film protrudes, metal films to be the metal layers are reliably formed on the surface of the side wall of each of the first opening and the second opening.

A protection film made of an inorganic insulating film may be provided between the semiconductor layer and the metal layers, the protection film may be provided with a third opening which overlaps the first opening and is larger than the first opening in plan view, and a fourth opening which overlaps the second opening and is larger than the second opening in plan view, and the side wall of the first opening and a side wall of the third opening may be continuous, and the side wall of the second opening and a side wall of the fourth opening may be continuous. Here, the side wall of each of the third opening and the fourth opening may be tilted such that a portion closer to the semiconductor layer protrudes.

According to the above configuration, the side wall of the first opening in the semiconductor layer and the side wall of the third opening in the protection film are continuous, and the side wall of the second opening in the semiconductor layer and the side wall of the fourth opening in the protection film are continuous. Thus, only the side walls of the first opening and the second opening formed in the semiconductor layer are exposed from the protection film, and the metal layers are specifically in contact with only the side walls of the first opening and the second opening formed in the semiconductor layer. If the side wall of each of the third opening and the fourth opening is tilted in a tapered shape such that a portion closer to the semiconductor layer protrudes, metal films to be the metal layers are reliably formed on the surface of the side wall of each of the third opening and the fourth opening.

A protection film made of an inorganic insulating film may be provided between the semiconductor layer and the metal layers, the protection film may be provided with a third opening which overlaps the first opening and is larger than the first opening in plan view, and a fourth opening which overlaps the second opening and is larger than the second opening in plan view, and an edge of the first opening in the semiconductor layer may be exposed from the third opening, and an edge of the second opening in the semiconductor layer may be exposed from the fourth opening. The side wall of each of the third opening and the fourth opening may be tilted in a tapered shape such that a portion closer to the semiconductor layer protrudes. Further, the length of the edge of each of the first opening and the second opening in the semiconductor layer, the edge being exposed from the third opening and the fourth opening, respectively, may be 0.05 µm to 0.5 µm.

According to the above configuration, the edge of the first opening in the semiconductor layer is exposed from the third opening in the protection film, and the edge of the second opening in the semiconductor layer is exposed from the fourth opening in the protection film. Thus, in the multilayered structure of the semiconductor layer and the protection film, the first opening and the third opening have a stepped structure, and the second opening and the fourth opening have a stepped structure. This structure increases the contact area between the metal layers and the semiconductor layer, and therefore, desired contact characteristics between the metal layers and the semiconductor layer are easily achieved. If the length of the edge of each of the first opening and the second opening in the semiconductor layer, the edge being exposed from the third opening and the fourth opening, respectively, is less than 0.05 µm, the desired contact characteristics may not be achieved. If the length of the edge of each of the first opening and the second opening in the semiconductor layer, the edge being exposed from the third opening and the fourth opening, respectively, is greater than 0.5 µm, the source electrode and the drain electrode may be short-circuited. Further, if the side wall of each of the third opening and the fourth opening is tilted in a tapered shape such that a portion closer to the semiconductor layer protrudes, metal films to be the metal layers are reliably formed on the surfaces of the side walls of the third opening and the fourth opening. The desired contact characteristics specifically mean that the contact resistance (e.g., 20 kΩ or less) is sufficiently low with respect to the channel resistance and that current-voltage characteristics exhibit linear characteristics.

The semiconductor layer may include a separation portion, which serves as the diffusion reducing portion, so that a region outside the channel region is separated from the gate insulating film, the metal layers, the source electrode, and the drain electrode may be provided between the gate insulating film and the separation portion of the semiconductor layer, and the metal layers may be in contact with the semiconductor layer via the separation portion.

According to the above configuration, the diffusion reducing portion is the separation portion provided in the semiconductor layer and separated from the gate insulating film, and the metal layers are in contact with part of the bottom surface of the semiconductor layer via the separation portion. Thus, the contact area between the semiconductor layer and the metal layers is specifically reduced.

An upper protection film made of an inorganic insulating film may be provided on the semiconductor layer to cover the semiconductor layer.

According to the above configuration, an upper protection film is provided on the semiconductor layer. Therefore, reliability of the back channel interface of the semiconductor layer is improved.

A lower protection film made of an inorganic insulating film may be provided between the separation portion of the semiconductor layer, and the source electrode and the drain electrode, to cover upper surfaces of the source electrode and the drain electrode.

According to the above configuration, a lower protection film is provided between the separation portion of the semiconductor layer, and the source electrode and the drain electrode, to cover upper surfaces of the source electrode and the drain electrode. Thus, for example, in the case where the source electrode and the drain electrode are made of copper or aluminum, contamination of the semiconductor layer with metals, e.g., copper and aluminum, is reduced.

The source electrode and the drain electrode may be provided on the metal layers, and the metal layers may protrude more than the source electrode and the drain electrode, at portions where the metal layers are in contact with the separation portion of the semiconductor layer. Here, the side surface of each of the source electrode and the drain electrode, at which each of the source electrode and the drain electrode is in contact with the separation portion, may be tilted such that a portion closer to the metal layers protrudes, and the side surface of each of the metal layers, at which each of the metal layers is in contact with the separation portion, may be tilted such that a portion closer to the gate insulating film protrudes at an angle smaller than the side surface of each of the source electrode and the drain electrode.

According to the above configuration, the source electrode and the drain electrode are formed on the metal layers, and the metal layers protrude more than the source electrode and the drain electrode at portions where the metal layers are in contact with the separation portion of the semiconductor layer. Thus, the portion on the substrate on which the semiconductor layer is to be provided has a (forward tapered) cross-section in which a portion closer to the substrate protrudes. This means that a semiconductor film to be the semiconductor layer can be deposited on the substrate with a sufficient covering property.

A channel protection film, which serves as the diffusion reducing portion, may be provided on the semiconductor layer to cover an upper surface of the semiconductor layer but not cover a side surface of the semiconductor layer, and the metal layers may be in contact with the side surface of the semiconductor layer which is not covered by the channel protection film.

According to the above configuration, the diffusion reducing portion is the channel protection film provided on the semiconductor layer, and the metal layers are in contact with the side surface of the semiconductor layer not covered by the channel protection film. Thus, the contact area between the semiconductor layer and the metal layers is specifically reduced.

The diffusion reducing portion may be configured to reduce a thickness of the semiconductor layer at the conductive region.

According to the above configuration, the diffusion reducing portion is configured to reduce the thickness of the semiconductor layer at the conductive region. Thus, even if the conductive region is excessively formed in the semiconductor layer and is heated, for example, in a succeeding annealing step to improve the properties of the semiconductor layer, the portion of the semiconductor layer with a reduced thickness serves as a bottleneck, and as a result, diffusion of the conductive region into the channel region of the semiconductor layer is reduced.

The semiconductor layer may include a first reduced thickness portion and a second reduced thickness portion, each corresponding to the conductive region, having a thickness smaller than a thickness of the semiconductor layer where the channel region is formed, and serving as the diffusion reducing portion, and the metal layers may be in contact with the semiconductor layer via the first reduced thickness portion and the second reduced thickness portion.

According to the above configuration, the diffusion reducing portion is the first reduced thickness portion and the second reduced thickness portion of the semiconductor layer, and the metal layers are in contact with semiconductor layer via the first reduced thickness portion and the second reduced thickness portion. Thus, even if the conductive region is excessively formed in the semiconductor layer due to a large contact area between the semiconductor layer and the metal layers, and the substrate is heated, for example, in the succeeding annealing step to improve the properties of the semiconductor layer, the first reduced thickness portion and the second reduced thickness portion of the semiconductor layer serve as bottlenecks, and diffusion of the conductive region into the channel region of the semiconductor layer is reduced.

The thickness of the semiconductor layer at the first reduced thickness portion and the second reduced thickness portion may be $1/10$ to $1/2$ of the thickness of the semiconductor layer where the channel region is formed.

According to the above configuration, the thickness of the semiconductor layer at the first reduced thickness portion and the second reduced thickness portion is $1/10$ to $1/2$ of the thickness of the semiconductor layer where the channel region is formed. Thus, advantages of the present disclosure are obtained. In the case where the thickness of semiconductor layer at the first reduced thickness portion and the second reduced thickness portion is less than $1/10$ of the thickness of the semiconductor layer where the channel region is formed, similar advantages as obtained in the case where the first opening and the second opening are formed in the semiconductor layer, and where the metal layers are in contact with the semiconductor layer via the side walls of the first opening and the second opening, are obtained. In the case where the thickness of semiconductor layer at the first reduced thickness portion and the second reduced thickness portion is greater than $1/2$ of the thickness of the semiconductor layer where the channel region is formed, the source electrode and the drain electrode may be short-circuited.

A display panel of the present disclosure includes a thin film transistor substrate including any one of the thin film transistors described above, a counter substrate located to face the thin film transistor substrate, and a display medium layer provided between the thin film transistor substrate and the counter substrate.

According to the above configuration, a display panel includes a thin film transistor substrate including one of the above-described thin film transistors, a counter substrate located to face the thin film transistor substrate, and a display medium layer provided between the two substrates. With this configuration, it is possible to reduce the contact resistance between the semiconductor layer made of an oxide semiconductor, and the source electrode and the drain electrode, and also possible to reduce short circuits of the source electrode and the drain electrode, in a thin film transistor for a display panel, such as a liquid crystal display panel and an organic electro luminescence (EL) panel.

The display medium layer may be a liquid crystal layer.

According to the above configuration, the display medium layer is a liquid crystal layer. Thus, in a thin film transistor for a liquid crystal display panel, it is possible to reduce a contact resistance between the semiconductor layer made of an oxide semiconductor, and the source electrode and the drain electrode, and possible to reduce short circuits of the source electrode and the drain electrode.

A method for fabricating a thin film transistor of the present disclosure includes: a step of forming a gate electrode on a substrate; a step of forming a gate insulating film to cover the gate electrode; a step of forming a semiconductor layer made of an oxide semiconductor and having a channel region overlapping the gate electrode, on the gate insulating film; a step of forming source/drain electrodes on the semiconductor layer via metal layers which are more easily reduced than the semiconductor layer, such that the source electrode and the drain electrode are spaced apart from each other, with the channel region interposed therebetween; and an annealing step in which the substrate on which the source electrode and the drain electrode are formed is heated to reduce the semiconductor layer in contact with the metal layers, thereby forming a conductive region in the semiconductor layer, wherein in the step of forming the semiconductor layer, a diffusion reducing portion for reducing diffusion of the conductive region into the channel region is formed in the semiconductor layer.

According to the above method, metal layers which are more easily reduced than a semiconductor layer made of an oxide semiconductor is formed between the semiconductor layer, and the source electrode and the drain electrode in the step of forming the source/drain electrodes, and in the annealing step, a conductive region reduced by contact with the metal layers are formed in the semiconductor layer. Thus, a contact resistance between the semiconductor layer, and the source electrode and the drain electrode is reduced. Further, a diffusion reducing portion for reducing diffusion of the conductive region into the channel region is formed in the semiconductor layer in the step of forming the semiconductor layer. Thus, conduction of the semiconductor layer is reduced, and thus, short circuits of the source electrode and the drain electrode are reduced. Due to the conductive region and the diffusion reducing portion formed in the semiconductor layer, a contact resistance between the semiconductor layer made of an oxide semiconductor, and the source electrode and the drain electrode, can be reduced, and short circuits of the source electrode and the drain electrode can be reduced.

In the step of forming the semiconductor layer, the diffusion reducing portion may be formed to reduce a contact area between the semiconductor layer and the metal layers.

According to the above method, a diffusion reducing portion is formed to reduce a contact area between the semiconductor layer and the metal layers in the step of forming the semiconductor layer. Thus, an unnecessary oxidation-reduction reaction at the interface between the semiconductor layer and the metal layers is reduced. In this configuration, excessive formation of the conductive region in the semiconductor layer is reduced, and thus, even if the substrate is heated, for example, in a succeeding annealing step to improve the properties of the semiconductor layer, diffusion of the conductive region into the channel region of the semiconductor layer can be reduced.

In the step of forming the semiconductor layer, the diffusion reducing portion may be formed by forming a first opening and a second opening in the semiconductor layer to expose the gate insulating film.

According to the above method, the diffusion reducing portion is formed by forming a first opening and a second opening in the semiconductor layer in the step of forming the semiconductor layer. Thus, the metal layers formed in the step of forming the source/drain electrodes are in contact with the semiconductor layer not via the bottoms but via the side walls of the first opening and the second opening, and the contact area between the semiconductor layer and the metal layers is specifically reduced.

The method may also include a step of forming a protection film by depositing an inorganic insulating film to cover the semiconductor layer, and forming, in the inorganic insulating film, a third opening overlapping the first opening and larger than the first opening in plan view, and a fourth opening overlapping the second opening and larger than the second opening in plan view, wherein in the step of forming the protection film, the third opening and the fourth opening may be formed such that a side wall of the first opening and a side wall of the third opening are continuous, and such that a side wall of the second opening and a side wall of the fourth opening are continuous.

According to the above method, the side wall of the first opening formed in the semiconductor layer in the step of forming the semiconductor layer, and the side wall of the third opening formed in the protection film in the step of forming the protection film are continuous. The side wall of the second opening formed in the semiconductor layer in the step of forming the semiconductor layer, and the side wall of the fourth opening formed in the protection film in the step of forming the protection film are continuous. Therefore, only the side walls of the first opening and the second opening formed in the semiconductor layer are exposed from the protection film, and the metal layers are specifically in contact with only the side walls of the first opening and the second opening formed in the semiconductor layer.

The method may also include a step of forming a protection film by depositing an inorganic insulating film to cover the semiconductor layer, and forming, in the inorganic insulating film, a third opening overlapping the first opening and larger than the first opening in plan view, and a fourth opening overlapping the second opening and larger than the second opening in plan view, wherein in the step of forming the protection film, the third opening and the fourth opening may be formed such that an edge of the first opening in the semiconductor layer is exposed from the third opening, and such that an edge of the second opening in the semiconductor layer is exposed from the fourth opening.

According to the above method, the edge of the first opening in the semiconductor layer formed in the step of forming the semiconductor layer is exposed from the third opening in the protection film formed in the step of forming the protection film, and the edge of the second opening in the semiconductor layer formed in the step of forming the semiconductor layer is exposed from the fourth opening in the protection film formed in the step of forming the protection film. Thus, in the multilayered structure of the semiconductor layer and the protection film, the first opening and the third opening have a stepped structure, and the second opening and the fourth opening have a stepped structure. This structure increases the contact area between the metal layers and the semiconductor layer, and therefore, desired contact characteristics between the metal layers and the semiconductor layer are easily achieved.

In the step of forming the semiconductor layer, in forming the semiconductor layer, a channel protection film as the diffusion reducing portion may be formed to cover an upper surface of the semiconductor layer but not cover a side surface of the semiconductor layer.

According to the above method, a channel protection film as the diffusion reducing portion is formed on the semiconductor layer in the step of forming the semiconductor layer, and the metal layers formed in the step of forming the source/drain electrodes are in contact with the side surface of the semiconductor layer which is not covered by the channel protection film. Thus, the contact area between the semiconductor layer and the metal layers is specifically reduced. Further, the semiconductor layer and the channel protection film having a same pattern are formed in the step of forming the semiconductor layer. Thus, the number of photomasks used in the fabrication of a thin film transistor is reduced, which reduces fabrication costs of the thin film transistor.

In the step of forming the semiconductor layer, the diffusion reducing portion may be formed to reduce a thickness of the semiconductor layer at the conductive region.

According to the above method, the diffusion reducing portion is formed to reduce a thickness of the semiconductor layer at the conductive region in the step of forming the semiconductor layer. Thus, even if the conductive region is excessively formed in the semiconductor layer, and the substrate is heated in the annealing step, the portion of the semiconductor layer with a reduced thickness serves as a bottleneck, and as a result, diffusion of the conductive region into the channel region of the semiconductor layer is reduced.

In the step of forming the semiconductor layer, the diffusion reducing portion may be formed by forming, in the semiconductor layer, a first reduced thickness portion and a second reduced thickness portion, each corresponding to the conductive region and having a thickness smaller than a thickness of the semiconductor layer where the channel region is formed.

According to the above method, the first reduced thickness portion and the second reduced thickness portion as diffusion reducing portions are formed in the semiconductor layer in the step of forming the semiconductor layer, and the metal layers formed in the step of forming the source/drain electrodes are in contact with the semiconductor layer via the first reduced thickness portion and the second reduced thickness portion. Thus, even if the conductive region is excessively formed in the semiconductor layer due to a large contact area between the semiconductor layer and the metal layers, and the substrate is heated in the succeeding annealing step, the first reduced thickness portion and the second reduced thickness portion of the semiconductor layer serve as bottlenecks, and diffusion of the conductive region into the channel region of the semiconductor layer is reduced.

A method for fabricating a thin film transistor of the present disclosure includes: a step of forming a gate electrode on a substrate; a step of forming a gate insulating film to cover the gate electrode; a step of forming source/drain electrodes on the gate insulating film via metal layers which are more easily reduced than an oxide semiconductor, such that the source electrode and the drain electrode overlap the gate electrode and are spaced apart from each other; a step of forming a semiconductor layer made of the oxide semiconductor and having a channel region between the source electrode and the drain electrode; and an annealing step in which the substrate on which the semiconductor layer is formed is heated to reduce the semiconductor layer in contact with the metal layers, thereby forming a conductive region in the semiconductor layer, wherein in the step of forming the semiconductor layer, a separation portion in contact with a side surface of each of the metal layers is formed in the semiconductor layer, as a diffusion reducing portion for reducing diffusion of the conductive region into the channel region.

According to the above method, the source electrode and the drain electrode are formed on the gate insulating film via metal layers, which are more easily reduced than the oxide semiconductor, in the step of forming the source/drain electrodes. In the step of forming the semiconductor layer, the semiconductor layer made of the oxide semiconductor and having a channel region between the source electrode and the drain electrode is formed. In the annealing step, the conductive region reduced by the contact with the metal layers is formed in the semiconductor layer. Therefore, the contact resistance between the semiconductor layer, and the source electrode and the drain electrode is reduced. Further, in the step of forming the semiconductor layer, a separation portion as the diffusion reducing portion for reducing diffusion of the conductive region into the channel region is formed in the semiconductor layer, and the separation portion is in contact with each of the side surfaces of the metal layers. Thus, conduction of the channel region of the semiconductor layer is reduced, and short circuits of the source electrode and the drain electrode are reduced. By forming the conductive region and the diffusion reducing portion in the semiconductor layer, it is possible to reduce the contact resistance between the semiconductor layer made of the oxide semiconductor, and the source electrode and the drain electrode, and possible to reduce short circuits of the source electrode and the drain electrode.

In the step of forming the source/drain electrodes, after forming the source electrode and the drain electrode by wet etching, the metal layers may be formed by dry etching to protrude more than the source electrode and the drain electrode.

According to the above method, the source electrode and the drain electrode are formed by wet etching in the step of forming the source/drain electrodes, and therefore, the side surface of the peripheral portion of each of the source electrode and the drain electrode is tilted such that a portion closer to the gate insulating film protrudes. After that, the metal layers are formed by dry etching to protrude more than the source electrode and the drain electrode. As a result, the peripheral portion of the multilayered structure of the metal layers and the source electrode and the drain electrode has a stepped structure.

Advantages of the Invention

In the present disclosure, a semiconductor layer is provided with a conductive region that is in contact with an easily reducible metal layer, and a diffusion reducing portion for reducing diffusion of the conductive region into a channel region. It is thus possible to reduce a contact resistance between the semiconductor layer made of an oxide semiconductor, and a source electrode and a drain electrode, and possible to reduce short circuits of the source electrode and the drain electrode.

DESCRIPTION OF EMBODIMENTS

Embodiments of the present disclosure will be described in detail below, based on the drawings. The present disclosure is not limited to the embodiments below.

<<First Embodiment of Invention>>

Figure 1:
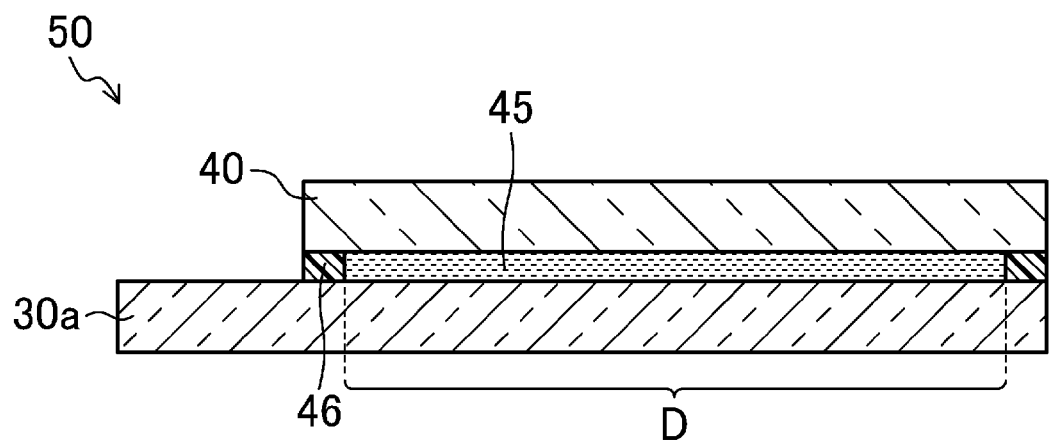
FIG. 1 is a cross-sectional view of a liquid crystal display panel of the first embodiment.
Figure 2:
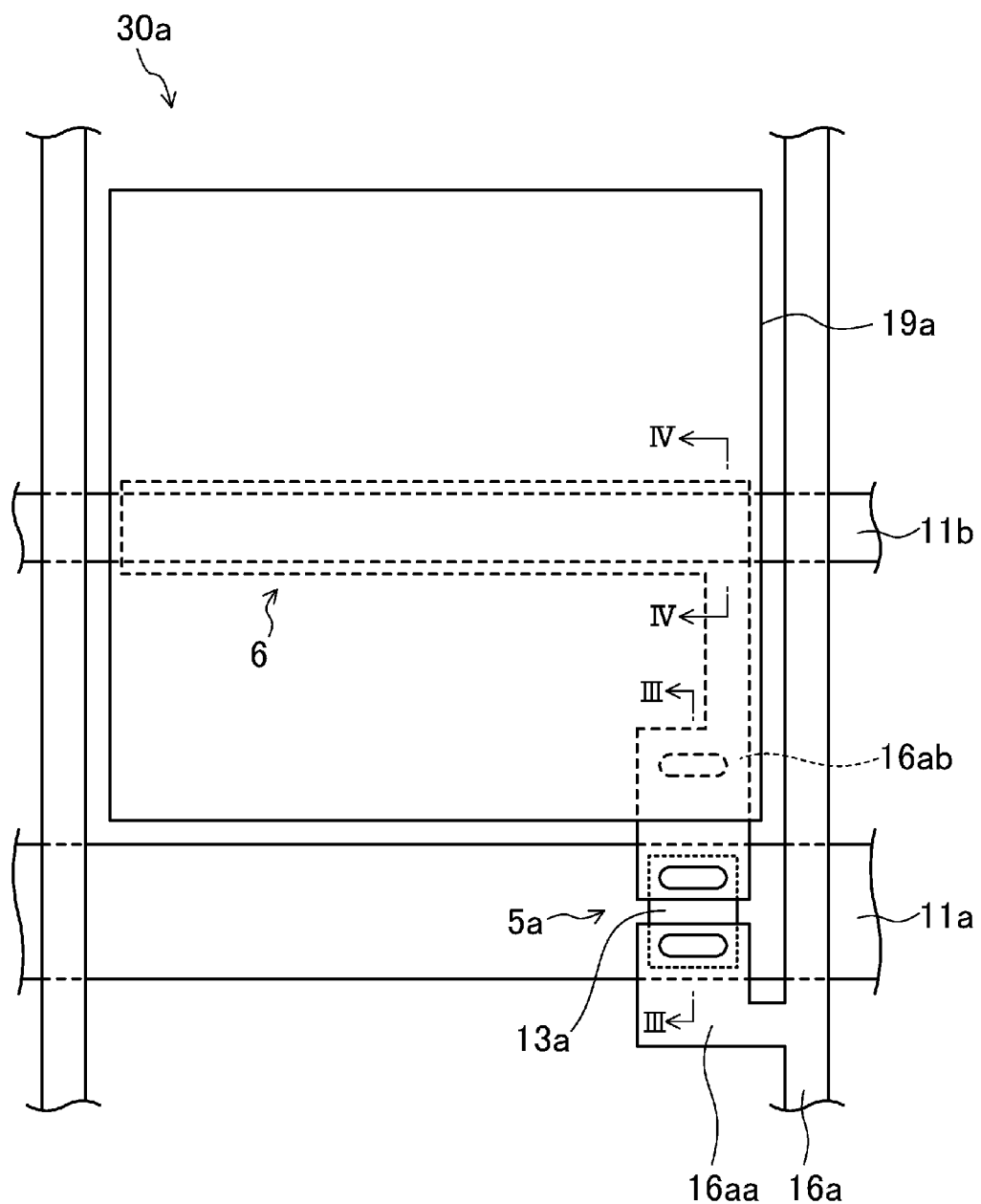
FIG. 2 is a plan view of a TFT substrate of the first embodiment.
Figure 3:
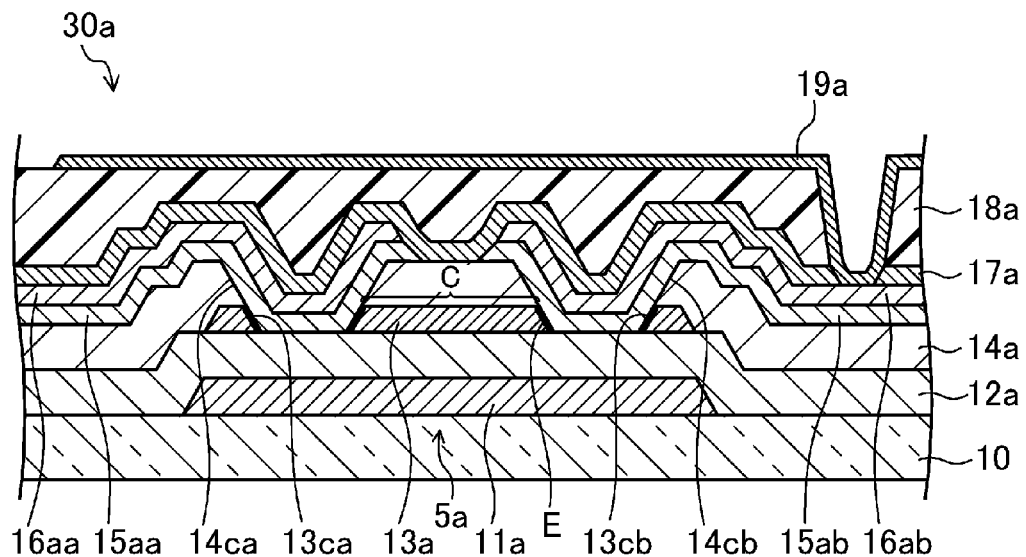
FIG. 3 is a cross-sectional view of the TFT substrate taken along the line III-III of FIG. 2.

FIG. 1 to FIG. 9 show the first embodiment of a TFT, a display panel, and a method for fabricating the TFT according to the present disclosure. Specifically, FIG. 1 is a cross-sectional view of a liquid crystal display panel 50 of the present embodiment. FIG. 2 is a plan view of a TFT substrate 30a which comprises the liquid crystal display panel 50. FIG. 3 is a cross-sectional view of the TFT substrate 30a taken along the line III-III of FIG. 2.

Figure 4:
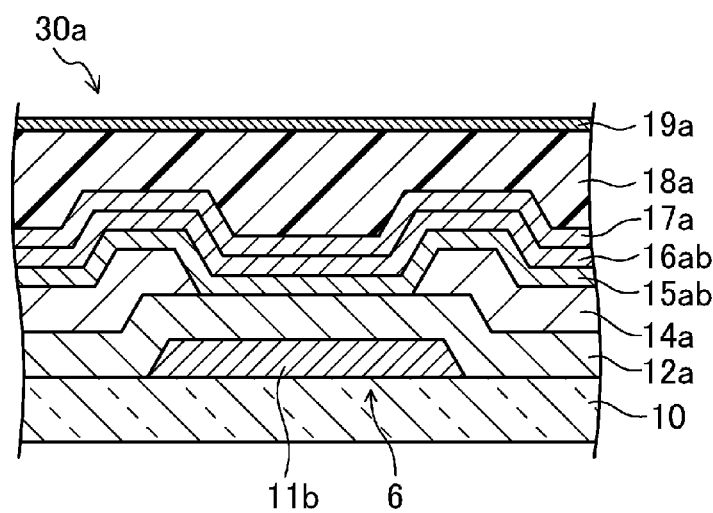
FIG. 4 is a cross-sectional view of the TFT substrate taken along the line IV-IV of FIG. 2.
Figure 5:
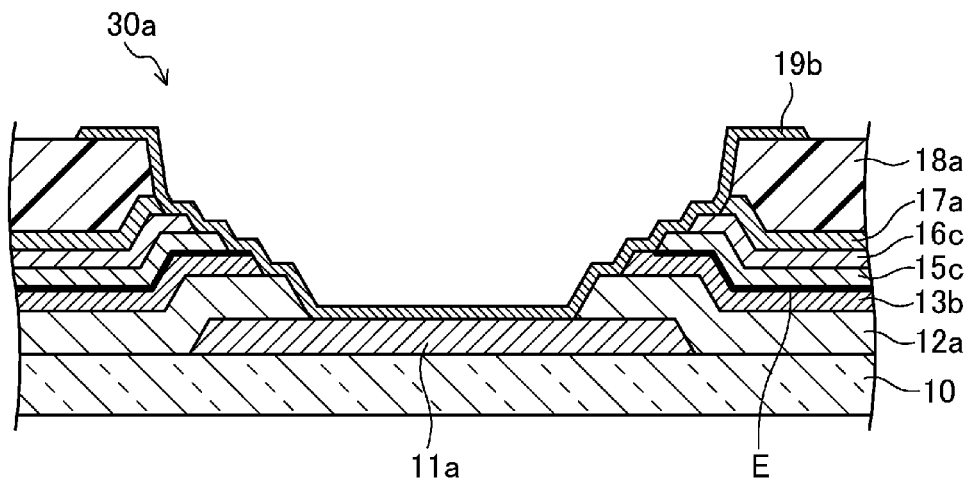
FIG. 5 is a cross-sectional view of a contact portion between a gate layer and a source layer in the TFT substrate of the first embodiment.
Figure 6:
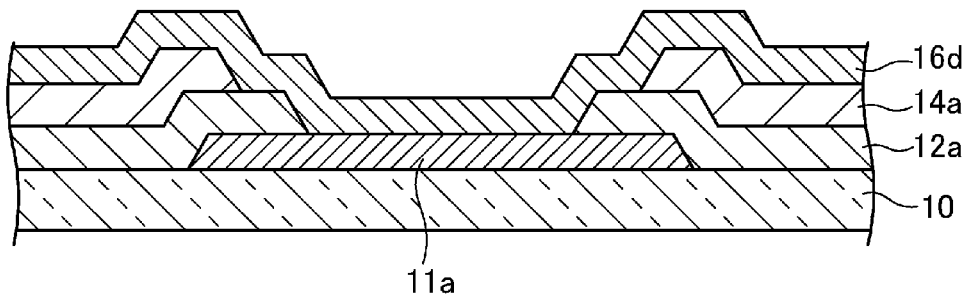
FIG. 6 is a cross-sectional view of the first variation of the contact portion between the gate layer and the source layer of the first embodiment.
Figure 7:
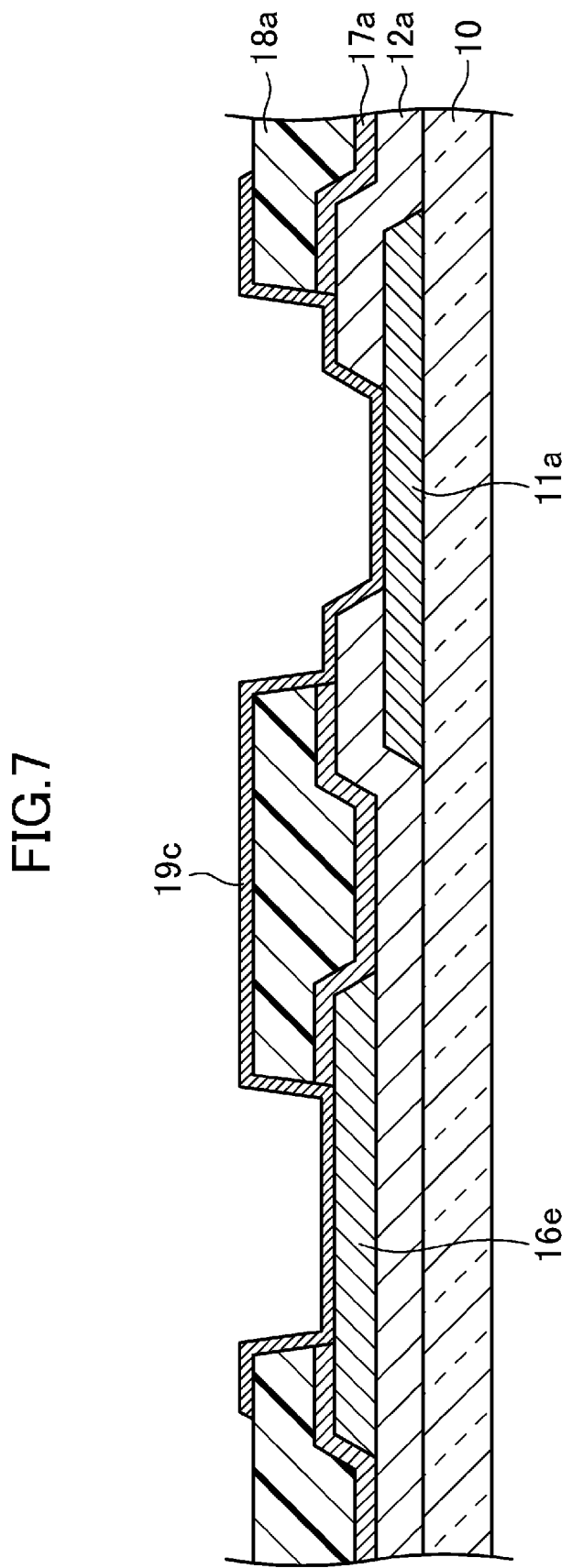
FIG. 7 is a cross-sectional view of the second variation of the contact portion between the gate layer and the source layer of the first embodiment.

FIG. 4 is a cross-sectional view of the TFT substrate 30a taken along the line IV-IV of FIG. 2. FIG. 5 is a cross-sectional view of a portion of the TFT substrate 30a where a gate layer and a source layer are connected to each other. FIG. 6 is a cross-sectional view of the first variation of the portion of the TFT substrate 30a where the gate layer and the source layer are connected to each other. FIG. 7 is a cross-sectional view of the second variation of the portion of the TFT substrate 30a where the gate layer and the source layer are connected to each other.

As shown in FIG. 1, the liquid crystal display panel 50 includes a TFT substrate 30a and a counter substrate 40 located to face each other, a liquid crystal layer 45 which is a display medium layer provided between the TFT substrate 30a and the counter substrate 40, and a frame-like sealing material 46 for bonding the TFT substrate 30a and the counter substrate 40 together and enclosing the liquid crystal layer 45 between the TFT substrate 30a and the counter substrate 40. In the liquid crystal display panel 50, as shown in FIG. 1, an area inside the frame-like sealing material 46 is defined as a display region D configured to display an image.

As shown in FIG. 2 and FIG. 3, the TFT substrate 30a includes: an insulating substrate 10; a plurality of gate lines 11a provided on the insulating substrate 10 so as to extend in parallel to each other; a plurality of capacitor lines 11b each provided between the gate lines 11a so as to extend in parallel to each other; a plurality of source lines 16a extending in parallel to each other in a direction orthogonal to the gate lines 11a; a plurality of TFTs 5a each of which is provided for an intersection of the gate line 11a and the source line 16a, that is, provided for each of the sub-pixels; a first interlayer insulating film 17a covering each of the TFTs 5a; a second interlayer insulating film 18a covering the first interlayer insulating film 17a; a plurality of pixel electrodes 19a provided in a matrix on the second interlayer insulating film 18a; and an alignment film (not shown) covering the pixel electrodes 19a.

As shown in FIG. 5, the gate line 11a is connected to a gate lead-out line 16c formed in the same layer as the source line 16a and made of the same material as the source line 16a, via a transparent conductive layer 19b formed in the same layer as the pixel electrode 19a and made of the same material as the pixel electrode 19a, in a region outside the display region D, for example. As shown in FIG. 5, a metal layer 15c is provided below the gate lead-out line 16c, and projects from the gate lead-out line 16c. Further, as shown in FIG. 5, a semiconductor layer 13b is provided below the metal layer 15c, and projects from the metal layer 15c. As shown in FIG. 5, the gate insulating film 12a, the semiconductor layer 13b, the metal layer 15c, the gate lead-out line 16c, the first interlayer insulating film 17a (and the second interlayer insulating film 18a) are formed in a step-like manner at a contact portion between the gate line 11a and the gate lead-out line 16c. This configuration results in a relatively large contact area with the transparent conductive layer 19b, and it is therefore possible to connect the gate layer (the gate line 11a) and the source layer (the gate lead-out line 16c) with low resistance. Here, the connection structure between the gate layer and the source layer may be that the gate lead-out line 16d, which is formed in the same layer as the source line 16a and made of the same material as the source line 16a, is directly connected to the gate line 11a as shown in FIG. 6, or may be that a gate lead-out line 16e, which is formed in the same layer as the source line 16a and made of the same material as the source line 16a, is connected to the gate line 11a via a transparent conductive layer 19c, which is formed in the same layer as the pixel electrode 19a and made of the same material as the pixel electrode 19a, as shown in FIG. 7. The present embodiment and variations thereof illustrate the connection structure between the gate layer and the source layer in which the gate line 11a is connected to the gate lead-out lines 16c, 16d and 16e, which are formed in the same layer as the source line 16a and made of the same material as the source line 16a. However, the present disclosure is applicable to the connection structure between the gate layer and the source layer in which the source line 16a is connected to a source lead-out line formed in the same layer as the gate line 11a and made of the same material as the gate line 11a.

As shown in FIG. 2 and FIG. 3, each of the TFTs 5a includes: a gate electrode (11a) provided on the insulating substrate 10; a gate insulating film 12a covering the gate electrode (11a); a semiconductor layer 13a provided on the gate insulating film 12a and having a channel region C which overlaps the gate electrode (11a); and a source electrode 16aa and a drain electrode 16ab formed on the semiconductor layer 13a via metal layers 15aa and 15ab, respectively, and spaced apart from each other, with the channel region C interposed therebetween.

The gate electrode (11a) is part of each of the gate lines 11a, as shown in FIG. 2.

The semiconductor layer 13a is made of an In—Ga—Zn—O-based oxide semiconductor. As shown in FIG. 3, the semiconductor layer 13a has a first opening 13ca and a second opening 13cb through which the gate insulating film 12a is exposed. Each side wall of the first opening 13ca and the second opening 13cb is tilted in a forward tapered shape such that a portion closer to the gate insulating film 12a protrudes as shown in FIG. 3. Further, the semiconductor layer 13a includes a conductive region E, which is reduced by contact with the metal layers 15aa and 15ab, on each of the side walls of the first opening 13ca and the second opening 13cb as shown in FIG. 3. The first opening 13ca and the second opening 13cb are provided to reduce the contact area between the semiconductor layer 13a and the metal layers 15aa and 15ab, as diffusion reducing portions configured to reduce diffusion of the conductive region E into the channel region C.

As shown in FIG. 3, a protection film 14a is provided between the semiconductor layer 13a and the metal layers 15aa and 15ab. As shown in FIG. 3, the protection film 14a is provided with a third opening 14ca which overlaps the first opening 13ca and is larger (i.e., having a larger aperture) than the first opening 13ca in plan view, and is provided with a fourth opening 14cb which overlaps the second opening 13cb and is larger (i.e., having a larger aperture) than the second opening 13cb in plan view. Each side wall of the third opening 14ca and the fourth opening 14cb is tilted in a forward tapered shape such that a portion closer to the semiconductor layer 13a protrudes as shown in FIG. 3. The side wall of the third opening 14ca and the side wall of the first opening 13ca are continuous as shown in FIG. 3. The side wall of the fourth opening 14cb and the side wall of the second opening 13cb are continuous as shown in FIG. 3.

The metal layers 15aa and 15ab are made, for example, of titanium and molybdenum, which are more easily reduced than the semiconductor layer 13a, and the metal layers 15aa and 15ab are in contact with the semiconductor layer 13a, only via the side walls of the first opening 13ca and the second opening 13cb.

As shown in FIG. 2, the source electrode 16aa is an L-shaped laterally protruding portion of the source line 16a for each sub-pixel.

As shown in FIG. 3, the drain electrode 16ab is connected to the pixel electrode 19a via a contact hole formed in a multilayer film of the first interlayer insulating film 17a and the second interlayer insulating film 18a. Further, as shown in FIG. 2, the drain electrode 16ab is provided so as to overlap the capacitor line 11b in each sub-pixel. As shown in FIG. 4, the drain electrode 16ab forms an auxiliary capacitor 6 by overlapping the capacitor line 11b via the gate insulating film 12a and the metal layer 15ab.

The counter substrate 40 includes, for example, an insulating substrate (not shown), a black matrix (not shown) provided in a grid pattern on the insulating substrate, a plurality of color layers (not shown) including red, green, and blue layers provided between the grid lines of the black matrix, a common electrode (not shown) covering the black matrix and each of the color layers, a plurality of columnar photo spacers (not shown) provided on the common electrode, and an alignment film (not shown) covering the common electrode.

The liquid crystal layer 45 is made of a nematic liquid crystal material having electro-optic characteristics.

In the liquid crystal display panel 50 having the above configuration, a predetermined voltage is applied for each sub-pixel across the liquid crystal layer 45 between the pixel electrode 19a of the TFT substrate 30a and the common electrode of the counter substrate 40, to change the aligned state of the liquid crystal layer 45, whereby the transmittance of light passing through the panel is adjusted for each sub-pixel, and thus an image is displayed.

Figure 8:
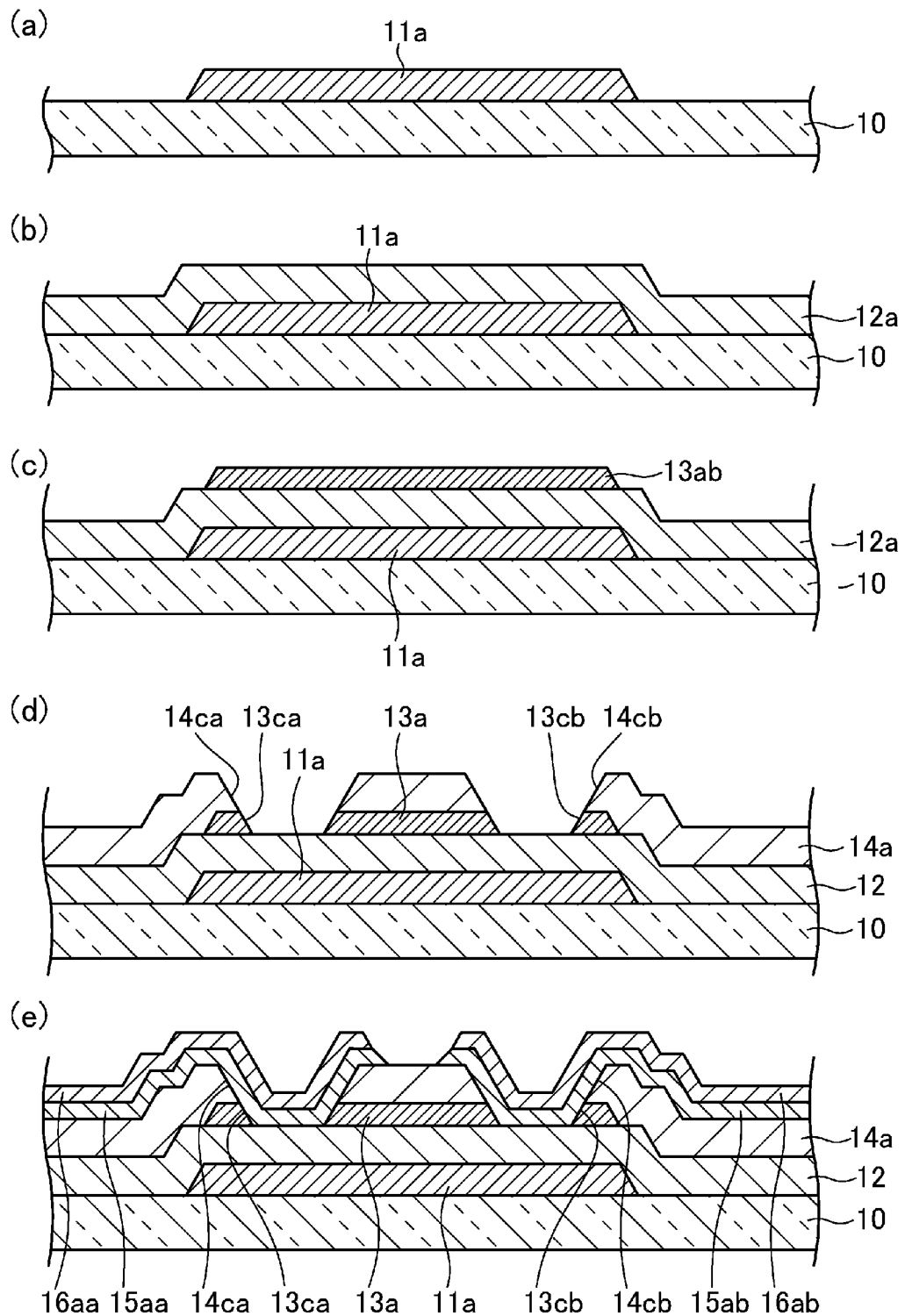
FIG. 8 illustrates cross sections of the TFT substrate of the first embodiment for explaining fabrication steps.

Next, a method for fabricating the TFT substrate 30a of the present embodiment will be described using FIG. 8. FIG. 8 illustrates cross sections of the TFT substrate 30a for explaining fabrication steps. The fabrication method of the present embodiment includes a step of forming a gate electrode, a step of forming a gate insulating film, a step of forming a semiconductor layer, a step of forming source and drain, a step of forming a first interlayer insulating film, an annealing step, a step of forming a second interlayer insulating film, and a step of forming a pixel electrode.

<Step of Forming Gate Electrode>

A titanium film (having a thickness of about 20 nm to 50 nm) and a copper film (having a thickness of about 100 nm to 400 nm), etc., are sequentially formed on the entire insulating substrate 10, such as a glass substrate, by sputtering, for example. After that, the multilayer metal film is subjected to photolithography, wet etching or dry etching, and resist removal and cleaning, thereby forming a gate line 11a, a gate electrode (11a), and a capacitor line 11b as shown in FIG. 8(a).

<Step of Forming Gate Insulating Film>

A silicon nitride film (having a thickness of about 200 nm to 400 nm) and a silicon oxide film (having a thickness of about 10 nm to 100 nm), etc., are sequentially formed by, for example, plasma chemical vapor deposition (CVD) on the entire substrate on which the gate line 11a and others are formed in the step of forming the gate electrode, thereby forming a gate insulating film 12a as shown in FIG. 8(b). In the present embodiment, the gate insulating film 12a has been illustrated as having a multilayered structure of the silicon oxide film (the upper layer)/the silicon nitride film (the lower layer), but the gate insulating film 12a may be a single layer, such as a silicon oxide film (having a thickness of about 80 nm to 250 nm) or a silicon nitride film (having a thickness of about 160 nm to 450 nm).

<Step of Forming Semiconductor Layer (Including Step of Forming Protection Film)>

First, an In—Ga—Zn—O-based oxide semiconductor film (having a thickness of about 20 nm to 100 nm) is formed by sputtering on the entire substrate on which the gate insulating film 12a is formed in the step of forming the gate insulating film. The oxide semiconductor film is subjected to photolithography, wet etching using oxalic acid, and resist removal and cleaning, thereby forming a semiconductor layer formation layer 13ab as shown in FIG. 8(c).

Subsequently, an inorganic insulating film, such as a silicon oxide film (having a thickness of about 50 nm to 300 nm) is formed by, for example, plasma CVD on the entire substrate on which the semiconductor layer formation layer 13ab is formed. After that, the inorganic insulating film is subjected to photolithography and dry etching using tetrafluoromethane gas/oxygen gas; the semiconductor layer formation layer 13ab is subjected to dry etching using chlorine gas/boron trichloride gas, for example; and resist removal and cleaning are performed, thereby forming a semiconductor layer 13a having a first opening 13ca and a second opening 13cb, and a protection film 14a having a third opening 14ca and a fourth opening 14cb, as shown in FIG. 8(d).

<Step of Forming Source/Drain Electrodes>

A titanium film (having a thickness of about 20 nm to 50 nm) and a copper film (having a thickness of about 100 nm to 400 nm), etc., are sequentially formed by, for example, sputtering on the entire substrate on which the semiconductor layer 13a and the protection film 14a are formed in the step of forming the semiconductor layer. After that, the multilayer metal film is subjected to photolithography, wet etching or dry etching, and resist removal and cleaning, thereby forming metal layers 15aa, 15ab and 15c from the titanium film, and a source line 16a, a source electrode 16aa, a drain electrode 16ab, and a gate lead-out line 16c from the copper film, as shown in FIG. 8(e). In the present embodiment, a titanium film is used as a metal film for forming the metal layers 15aa, 15ab and 15c, but the metal film may also be a molybdenum film, etc. Further, a copper film is used as a metal film for forming the source line 16a, the source electrode 16aa, the drain electrode 16ab, and the gate lead-out line 16c, but the metal film may also be an aluminum film, a multilayer film of a titanium film/an aluminum film, a multilayer film of a molybdenum film/an aluminum film, etc.

<Step of Forming First Interlayer Insulating Film>

An inorganic insulating film, such as a silicon oxide film (having a thickness of about 50 nm to 300 nm) is formed by, for example, plasma CVD on the entire substrate on which the source electrode 16aa, the drain electrode 16ab and others are formed in the step of forming the source/drain electrodes, thereby forming a first interlayer insulating film 17a.

<Annealing Step>

The substrate on which the first interlayer insulating film 17a is formed in the step of forming the first interlayer insulating film is heated at a temperature of about 300° C. to 400° C., thereby improving characteristics of the semiconductor layer 13a, and reducing the semiconductor layers 13a and 13b, which are in contact with the metal layers 15aa, 15ab and 15c, to form conductive regions E in the semiconductor layers 13a and 13b.

<Step of Forming Second Interlayer Insulating Film>

First, a photosensitive acrylic resin is applied in a thickness of about 2 nm by, for example, spin coating or slit coating, on the entire substrate in which the conductive regions E are formed in the annealing step. The applied film is subjected to exposure, development and baking, thereby forming a second interlayer insulating film 18a having a contact hole.

Subsequently, the first interlayer insulating film 17a exposed from the second interlayer insulating film 18a is subjected to wet etching or dry etching, thereby forming a contact hole in the first interlayer insulating film 17a. A contact hole is formed at this time in the gate insulating film 12a at a portion where the gate electrode 11a and the gate lead-out line 16c are to be connected to each other (see FIG. 5). It is therefore possible to form a contact hole for connecting the gate electrode 11a and the gate lead-out line 16c without increasing the fabrication steps.

<Step of Forming Pixel Electrode>

A transparent conductive film (having a thickness of about 100 nm), such as an indium tin oxide (ITO) film and an indium zinc oxide (IZO) film, is formed by, for example, sputtering on the entire substrate on which the second interlayer insulating film 18a is formed in the step of forming the second interlayer insulating film. After that, the transparent conductive film is subjected to photolithography, wet etching or dry etching, and resist removal and cleaning, thereby forming a pixel electrode 19a and a transparent conductive layer 19b.

The TFT substrate 30a of the present embodiment can be obtained by the method described above.

Figure 9:
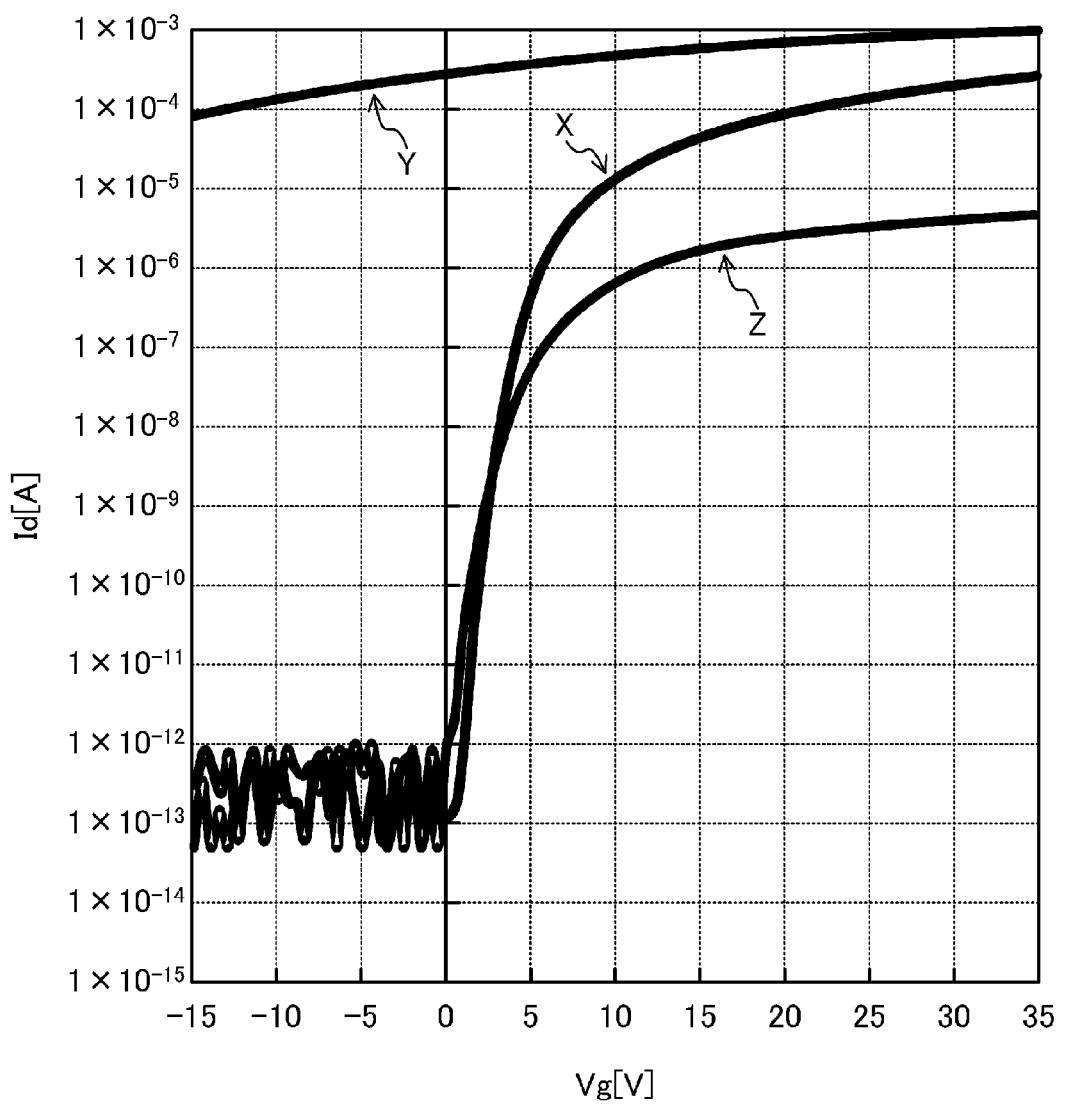
FIG. 9 is a graph showing characteristics of drain current and gate voltage of TFT substrates of an example, the first comparative example, and the second comparative example.

Next, tests that were performed will be described based on FIG. 9. FIG. 9 is a graph showing characteristics of drain current (Id) and gate voltage (Vg) of TFT substrates of an example, the first comparative example, and the second comparative example. In FIG. 9, the curve X shows the characteristics of the example; the curve Y shows the characteristics of the first comparative example; and the curve Z shows the characteristics of the second comparative example.

Figure 18:
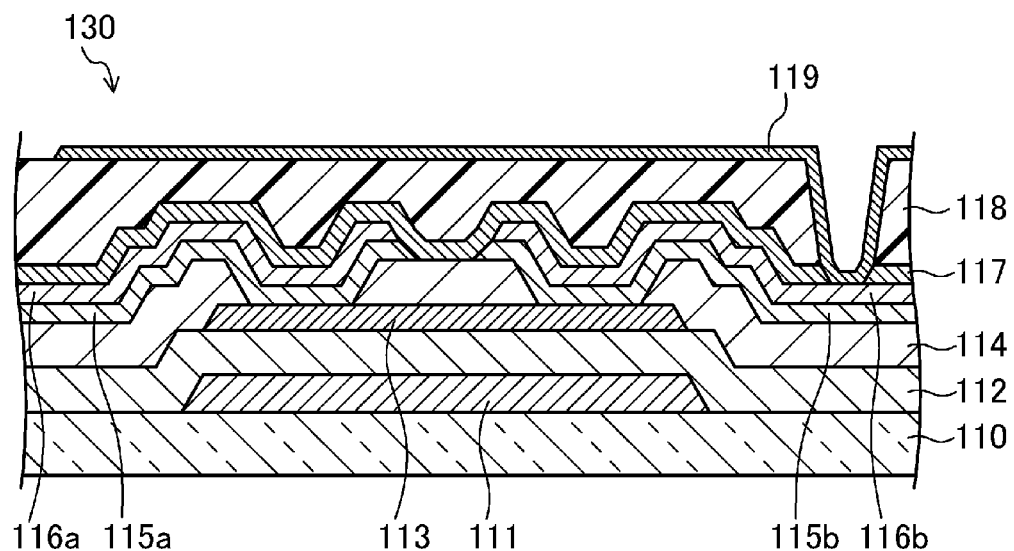
FIG. 18 is a cross-sectional view of the TFT substrate of the first comparative example.

Specifically, the TFT substrate 30a of the present embodiment was fabricated as an example of the present disclosure. The TFT substrate 130 shown in FIG. 18 was fabricated as the first comparative example of the present disclosure. The TFT substrate without the metal layers 115a and 115b of the TFT substrate 130 was fabricated as the second comparative example of the present disclosure. Characteristics of the drain current (Id) and the gate voltage (Vg) of each of the TFT substrates when a voltage between the source electrode and the drain electrode was set to 10 V were measured. Here, the TFT 130 includes, as shown in FIG. 18, an insulating substrate 110, a gate electrode 111 provided on the insulating substrate 110, a gate insulating film 112 covering the gate electrode 111, a semiconductor layer 113 provided on the gate insulating film 112, a protection film 114 provided on the semiconductor layer 113, a source electrode 116a and a drain electrode 116b provided on the semiconductor layer 113 via metal layers 115a and 115b, respectively, a first interlayer insulating film 117 covering the source electrode 116a and the drain electrode 116b, a second interlayer insulating film 118 covering the first interlayer insulating film 117, and a pixel electrode 119 provided on the second interlayer insulating film 118. The configuration of the TFT 130 is substantially the same as the configuration of the TFT substrate 30a of the present embodiment, except that the semiconductor layer 113 is not provided with the first opening and the second opening.

According to the test results, it was found that the on-state current was high in the example (curve X), that the source electrode and the drain electrode were short-circuited in the first comparative example (curve Y), and that the on-state current was low in the second comparative example (curve Z), as shown in FIG. 9.

It was assumed from the above tests: that in the first example, the on-state current was high because the contact resistance between the semiconductor layer 13a, and the source electrode 16aa and the drain electrode 16ab, was low due to the easily reducible metal layers 15aa and 15ab interposed between the semiconductor layer 13a, and the source electrode 16aa and the drain electrode 16ab, and also that because the contact area between the semiconductor layer 13a and the metal layers 15aa and 15ab was relatively small due to the first opening 13ca and the second opening 13cb in the semiconductor layer 13a, the diffusion of the conductive region E in the semiconductor layer 13a is reduced and the short circuits of the source electrode 16aa and the drain electrode 16ab are accordingly reduced; that in the first comparative example, because of a large contact area between the semiconductor layer 113 and the metal layers 115a and 115b, a conductive region due to the metal layers 115a and 115b was diffused into the semiconductor layer 113, making the semiconductor layer 113 conductive as a whole, and therefore, the source electrode and the drain electrode were short-circuited; and in the second comparative example, the on-state current was low (i.e., peaked out) because the contact resistance between the semiconductor layer, and the source electrode and the drain electrode, was high due to no metal layer that is easily reducible interposed between the semiconductor layer, and the source electrode and the drain electrode. In FIG. 3 and FIG. 18, the contact areas between the semiconductor layer and the metal layer are illustrated as not being much different from each other, but in fact, the contact area in the example is about 1/100 of the contact area in the first comparative example, because the thickness of the semiconductor layer is about 20 µm to 100 µm, and the aperture of the opening formed in the semiconductor layer is 2 µm at a minimum.

As described above, according to the TFTs 5a, the liquid crystal display panel 50, and a method for fabricating the TFTs 5a of the present embodiment, the metal layers 15aa and 15ab which are more easily reduced than the semiconductor layer 13a made of an oxide semiconductor are formed between the semiconductor layer 13a, and the source electrode 16aa and the drain electrode 16ab, in the step of forming source/drain electrodes, and the conductive region E reduced by the contact with the metal layers 15aa and 15ab is formed in the semiconductor layer 13a in the annealing step. It is therefore possible to reduce the contact resistance between the semiconductor layer 13a, and the source electrode 16aa and the drain electrode 16ab. Further, in the step of forming the semiconductor layer, the semiconductor layer 13a is provided with the first opening 13ca and the second opening 13cb which are diffusion reducing portions for reducing diffusion of the conductive region E into the channel region C. Therefore, conduction of the channel region C of the semiconductor layer 13a is reduced, and it is possible to reduce short circuits of the source electrode 16aa and the drain electrode 16ab. By forming the conductive region E, and the first opening 13ca and the second opening 13cb as diffusion reducing portions, in the semiconductor layer 13a, it is possible to reduce the contact resistance between the semiconductor layer 13a made of an oxide semiconductor, and the source electrode 16aa and the drain electrode 16ab, and possible to reduce short circuits of the source electrode 16aa and the drain electrode 16ab.

Further, according to the TFTs 5a, the liquid crystal display panel 50, and a method for fabricating and the TFTs 5a of the present embodiment, the first opening 13ca and the second opening 13cb are formed in the semiconductor layer 13a in the step of forming the semiconductor layer. Thus, the metal layers 15aa and 15ab formed in the step of forming the source/drain electrodes are in contact with the semiconductor layer 13a, only via the side walls, but not via the bottoms of the first opening 13ca and the second opening 13cb, respectively, and therefore, the contact area between the semiconductor layer 13a and the metal layers 15aa and 15ab is specifically reduced. It is therefore possible to reduce an unnecessary oxidation-reduction reaction at the interface between the semiconductor layer 13a and the metal layers 15aa and 15ab. In this configuration, excessive formation of the conductive region E in the semiconductor layer 13a can be reduced. Thus, even if the substrate is heated in a succeeding annealing step to improve the properties of the semiconductor layer 13a, diffusion of the conductive region E into the channel region C of the semiconductor layer 13a can be reduced.

<<Second Embodiment of Invention>>

Figure 10:
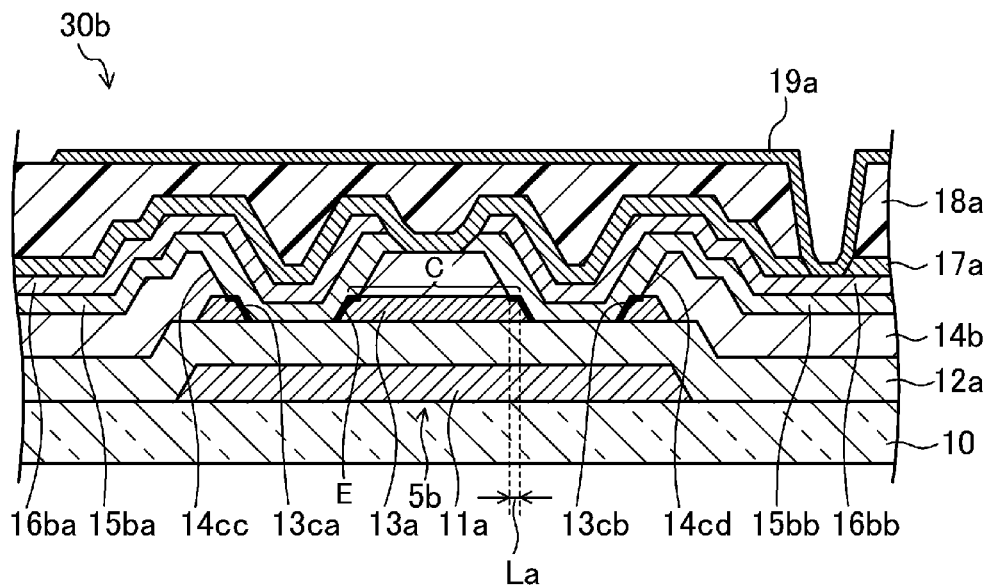
FIG. 10 is a cross-sectional view of a TFT substrate of the second embodiment.

FIG. 10 is a cross-sectional view of a TFT substrate 30b of the present embodiment.

In the embodiments below, like reference characters have been used to designate elements identical to the elements shown in FIG. 1 to FIG. 9, and detail explanation thereof is omitted.

The first embodiment illustrates the TFT substrate 30a and a method for fabricating the TFT substrate 30a including the TFT 5a in which the side wall of the first opening 13ca and the side wall of the third opening 14ca are continuous, and the side wall of the second opening 13cb and the side wall of the fourth opening 14cb are continuous. The present embodiment will illustrate a TFT substrate 30b and a method for fabricating the TFT substrate 30b including TFTs 5b in which the side wall of the first opening 13ca and the side wall of the third opening 14 cc are not continuous, and the side of the second opening 13cb and the side wall of the fourth opening 14cd are not continuous.

As shown in FIG. 10, the TFT substrate 30b includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5b each of which is provided for an intersection of the gate line 11a and the source line (16a), that is, provided for each of sub-pixels; a first interlayer insulating film 17a covering each of the TFTs 5b; a second interlayer insulating film 18a covering the first interlayer insulating film 17a; a plurality of pixel electrodes 19a provided in a matrix on the second interlayer insulating film 18a; and an alignment film (not shown) covering the pixel electrodes 19a. Similar to the TFT substrate 30a of the first embodiment, the TFT substrate 30b forms a liquid crystal display panel (50) together with a counter substrate (40), a liquid crystal layer (45) and a sealing material (46).

As shown in FIG. 10, each of the TFTs 5b includes: a gate electrode (11a) provided on the insulating substrate 10; a gate insulating film 12a covering the gate electrode (11a); a semiconductor layer 13a provided on the gate insulating film 12a and having a channel region C which overlaps the gate electrode (11a); and a source electrode 16ba and a drain electrode 16bb formed on the semiconductor layer 13a via metal layers 15ba and 15bb, respectively, and spaced apart from each other, with the channel region C interposed therebetween.

As shown in FIG. 10, a protection film 14b is provided between the semiconductor layer 13a and the metal layers 15ba and 15bb. As shown in FIG. 10, the protection film 14b is provided with a third opening 14 cc which overlaps the first opening 13ca and is larger (i.e., having a larger aperture) than the first opening 13ca in plan view, and is provided with a fourth opening 14cd which overlaps the second opening 13cb and is larger (i.e., having a larger aperture) than the second opening 13cb in plan view. Each side wall of the third opening 14 cc and the fourth opening 14cd is tilted in a forward tapered shape such that a portion closer to the semiconductor layer 13a protrudes as shown in FIG. 10. As shown in FIG. 10, the edge of each of the first opening 13ca and the second opening 13cb of the semiconductor layer 13a is exposed from the third opening 14 cc and the fourth opening 14cd. The length La (see FIG. 10) of the edge of each of the first opening 13ca and the second opening 13cb which is exposed from (the side walls of) the third opening 14 cc and the fourth opening 14cd is 0.05 μm to 0.5 μm. If the length La is less than 0.05 μm, the contact characteristics are equivalent to the contact characteristics of the TFT substrate 30a of the first embodiment. If the length La is greater than 0.5 μm, the source electrode 16ba and the drain electrode 16bb may be short-circuited.

The metal layers 15ba and 15bb are made, for example, of titanium and molybdenum, which are more easily reduced than the semiconductor layer 13a, and the metal layers 15ba and 15bb are in contact with the semiconductor layer 13a via the side walls of the first opening 13ca and the second opening 13cb and via the edge portions of the first opening 13ca and the second opening 13cb in the semiconductor layer 13a, as shown in FIG. 10.

The source electrode 16ba is an L-shaped laterally protruding portion of each of the source lines (16a, see FIG. 2) for each sub-pixel.

As shown in FIG. 10, the drain electrode 16bb is connected to the pixel electrode 19a via a contact hole formed in a multilayer film of the first interlayer insulating film 17a and the second interlayer insulating film 18a. Further, the drain electrode 16bb is provided so as to overlap the capacitor line (11b, see FIG. 2) in each sub-pixel.

The TFT substrate 30b can be fabricated by utilizing the fact that in the step of forming the semiconductor layer of the first embodiment, the semiconductor layer formation layer 13ab is etched at a lower speed than the inorganic insulating film (i.e., a silicon oxide film) when, for example, tetrafluoromethane gas/oxygen gas is used. Specifically, the semiconductor layer 13a and the protection film 14b are formed by performing photolithography, dry etching using the tetrafluoromethane gas/oxygen gas, and resist removal and cleaning, on the inorganic insulating film and the semiconductor layer formation layer 13ab, thereby forming the TFT substrate 30b. In the present embodiment, the inorganic insulating film and the semiconductor layer formation layer 13ab are dry etched using tetrafluoromethane gas/oxygen gas, thereby successively forming the semiconductor layer 13a and the protection film 14b. However, the semiconductor layer 13a and the protection film 14b may be formed by using a resist pattern for etching the inorganic insulating film, and using another resist pattern for etching the semiconductor layer formation layer 13ab.

As described above, according to the TFTs 5b, the TFT substrate 30b including the TFTs 5b, and a method for fabricating the TFT substrate 30b of the present embodiment, the semiconductor layer 13a is provided with the conductive region E, and the first opening 13ca and the second opening 13cb as diffusion reducing portions, similar to the first embodiment. It is thus possible to reduce the contact resistance between the semiconductor layer 13a made of an oxide semiconductor, and the source electrode 16ba and the drain electrode 16bb, and also possible to reduce short circuits of the source electrode 16ba and the drain electrode 16bb.

According to the TFTs 5b of the present embodiment and a method for fabricating the TFTs 5b, the edge of the first opening 13ca in the semiconductor layer 13a formed in the step of forming the semiconductor layer is exposed from the third opening 14 cc in the protection film 14b formed in the step of forming the protection film. Also, the edge of the second opening 13cb in the semiconductor layer 13a formed in the step of forming the semiconductor layer is exposed from the fourth opening 14cd in the protection film 14b formed in the step of forming the protection film. Thus, in the multilayered structure of the semiconductor layer 13a and the protection film 14b, the first opening 13ca and the third opening 14 cc have a stepped structure, and the second opening 13cb and the fourth opening 14cd have a stepped structure. This structure increases the contact area between the semiconductor layer 13a and the metal layers 15ba and 15bb, and therefore, desired contact characteristics between the semiconductor layer 13a and the metal layers 15ba and 15bb can be easily achieved.

<<Third Embodiment on Invention>>

Figure 11:
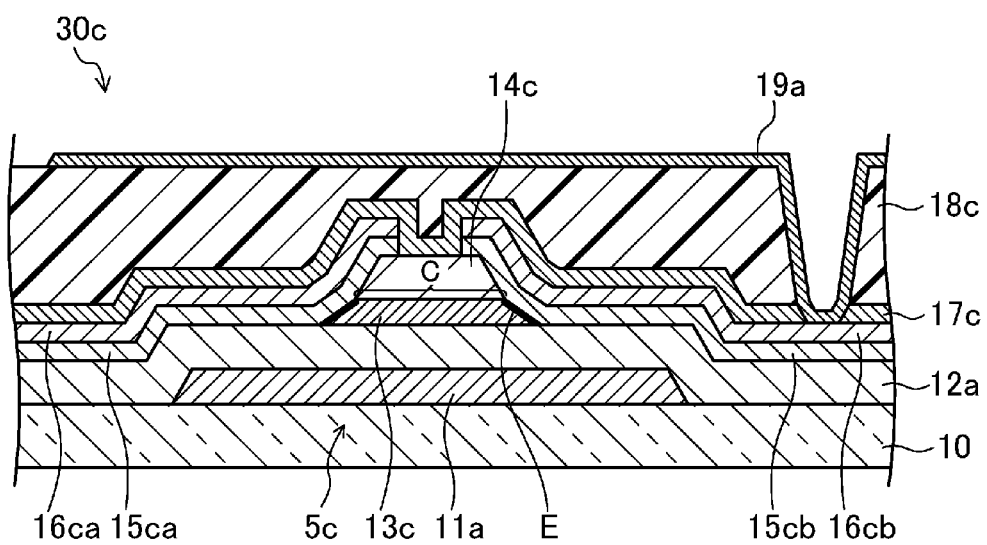
FIG. 11 is a cross-sectional view of a TFT substrate of the third embodiment.
Figure 12:
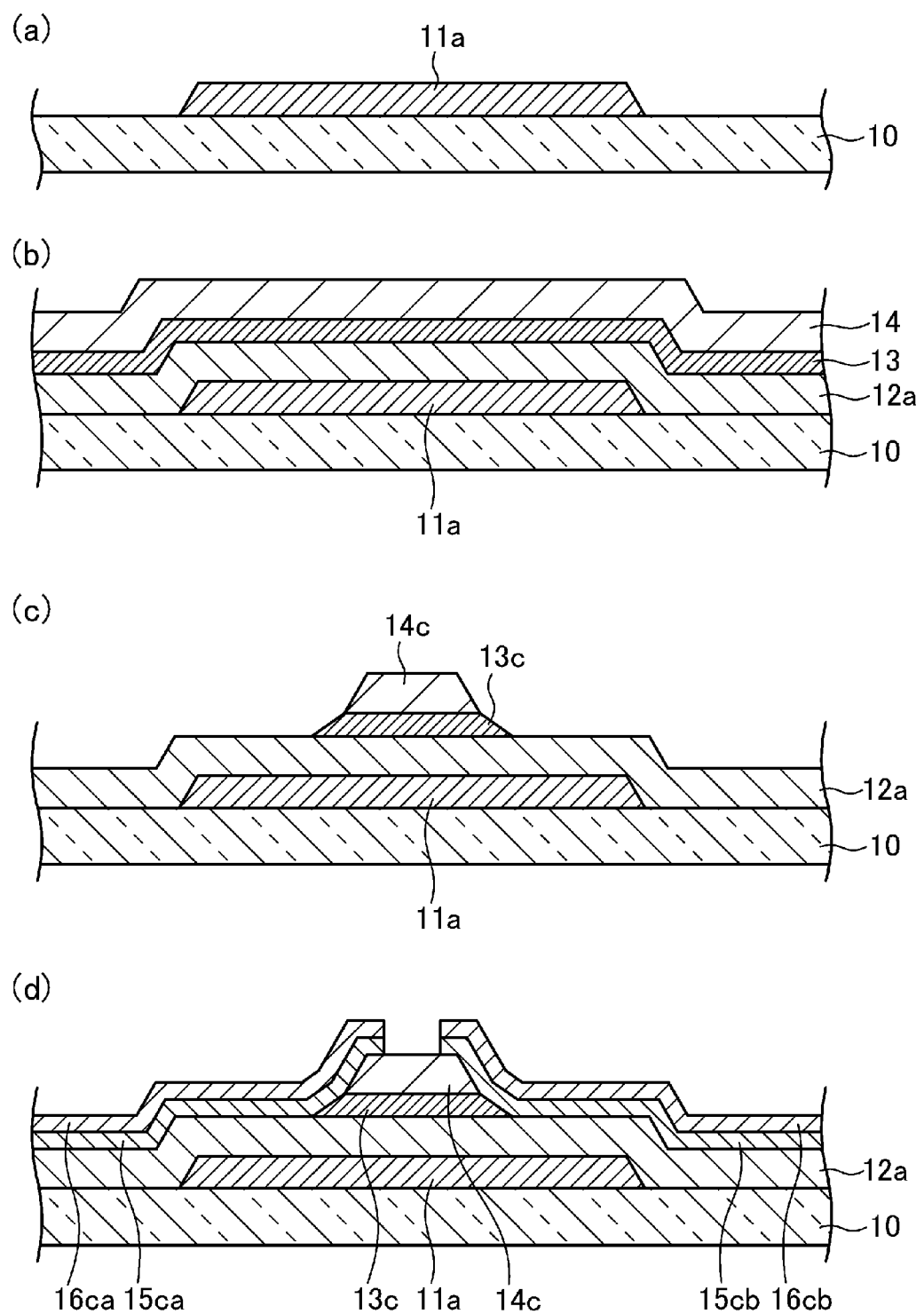
FIG. 12 illustrates cross sections of the TFT substrate of the third embodiment for explaining fabrication steps.

FIG. 11 is a cross-sectional view of a TFT substrate 30c of the present embodiment. FIG. 12 illustrates cross sections of the TFT substrate 30c for explaining fabrication steps.

The first and second embodiments illustrate the TFT substrates 30a and 30b and methods for fabricating the TFT substrates 30a and 30b in which the protection films 14a and 14b are relatively large. On the other hand, the present embodiment illustrates a TFT substrate 30c and a method for fabricating the TFT substrate 30c in which the protection film (channel protection film) 14c is relatively small.

As shown in FIG. 11, the TFT substrate 30c includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5c each of which is provided for an intersection of the gate line 11a and the source line (16a), that is, provided for each of sub-pixels; a first interlayer insulating film 17c covering each of the TFTs 5c; a second interlayer insulating film 18c covering the first interlayer insulating film 17c; a plurality of pixel electrodes 19a provided in a matrix on the second interlayer insulating film 18c; and an alignment film (not shown) covering the pixel electrodes 19a. Similar to the TFT substrate 30a of the first embodiment, the TFT substrate 30c forms a liquid crystal display panel (50) together with a counter substrate (40), a liquid crystal layer (45) and a sealing material (46).

As shown in FIG. 11, each of the TFTs 5c includes: a gate electrode (11a) provided on the insulating substrate 10; a gate insulating film 12a covering the gate electrode (11a); a semiconductor layer 13c provided on the gate insulating film 12a and having a channel region C which overlaps the gate electrode (11a); a channel protection film 14c provided on the semiconductor layer 13c as a diffusion reducing portion, covering the upper surface of the semiconductor layer 13c and exposing the side surface of the semiconductor layer 13c; and a source electrode 16ca and a drain electrode 16cb formed on the semiconductor layer 13c via the channel protection film 14c and metal layers 15ca and 15cb, respectively, and spaced apart from each other, with the channel region C interposed therebetween.

The semiconductor layer 13c is made, for example, of an In—Ga—Zn—O-based oxide semiconductor. Further, the semiconductor layer 13c includes a conductive region E which is reduced by contact with the metal layers 15ca and 15cb as shown in FIG. 11.

The metal layers 15ca and 15cb are made, for example, of titanium and molybdenum, which are more easily reduced than the semiconductor layer 13c, and as shown in FIG. 11, the metal layers 15ca and 15cb are in contact with the side surfaces of the semiconductor layer 13c not covered by the channel protection film 14c.

The source electrode 16ca is an L-shaped laterally protruding portion of the source line (16a, see FIG. 2) for each sub-pixel.

As shown in FIG. 11, the drain electrode 16cb is connected to the pixel electrode 19a via a contact hole formed in the multilayer film of the first interlayer insulating film 17c and the second interlayer insulating film 18c. Further, the drain electrode 16cb is provided so as to overlap the capacitor line (11b, see FIG. 2) in each sub-pixel.

Next, a method for fabricating the TFT substrate 30c of the present embodiment will be described using FIG. 12. The fabrication method of the present embodiment includes a step of forming a gate electrode, a step of forming a gate insulating film, a step of forming a semiconductor layer, a step of forming source and drain, a step of forming a first interlayer insulating film, an annealing step, a step of forming a second interlayer insulating film, and a step of forming a pixel electrode.

<Step of Forming Gate Electrode>

A titanium film (having a thickness of about 20 nm to 50 nm) and a copper film (having a thickness of about 100 nm to 400 nm), etc., are sequentially formed on the entire insulating substrate 10, such as a glass substrate, by sputtering, for example. After that, the multilayer metal film is subjected to photolithography, wet etching or dry etching, and resist removal and cleaning, thereby forming a gate electrode (11a) as shown in FIG. 12(a).

<Step of Forming Gate Insulating Film>

A silicon nitride film (having a thickness of about 200 nm to 400 nm) and a silicon oxide film (having a thickness of about 10 nm to 200 nm), etc., are sequentially formed by, for example, plasma CVD on the entire substrate on which the gate electrode (11a) is formed in the step of forming the gate electrode, thereby forming a gate insulating film 12a as shown in FIG. 12(b).

<Step of Forming Semiconductor Layer>

First, an In—Ga—Zn—O-based semiconductor film 13 (having a thickness of about 20 nm to 100 nm) is formed by sputtering on the entire substrate on which the gate insulating film 12a is formed in the step of forming the gate insulating film.

Subsequently, an inorganic insulating film 14, such as a silicon oxide film (having a thickness of about 50 nm to 300 nm) is formed by, for example, plasma CVD on the entire substrate on which the semiconductor film 13 is formed. After that, the multilayer film of the semiconductor film 13 and the inorganic insulating film 14 is subjected to photolithography, dry etching using gas, such as tetrafluoromethane gas/oxygen gas and chlorine gas/boron trichloride gas, and resist removal and cleaning, thereby forming a semiconductor layer 13c and a channel protection film 14c as shown in FIG. 12(c). The present embodiment illustrates a method in which the semiconductor film 13 is subjected to dry etching, but the semiconductor film 13 may be subjected to wet etching using an oxalic acid.

<Step of Forming Source/Drain Electrodes>

A titanium film (having a thickness of about 20 nm to 50 nm) and a copper film (having a thickness of about 100 nm to 400 nm), etc., are sequentially formed by, for example, sputtering on the entire substrate on which the semiconductor layer 13c and the channel protection film 14c are formed in the step of forming the semiconductor layer. After that, the multilayer metal film is subjected to photolithography, wet etching or dry etching, and resist removal and cleaning, thereby forming metal layers 15ca and 15cb from the titanium film, and a source electrode 16ca and a drain electrode 16cb from the copper film, as shown in FIG. 12(d). In the present embodiment, a titanium film is used as a metal film for forming the metal layers 15ca and 15cb, but the metal film may also be a molybdenum film, etc. Further, a copper film is used as a metal film for forming the source electrode 16ca and the drain electrode 16cb, but the metal film may also be an aluminum film, a multilayer film of a titanium film/an aluminum film, a multilayer film of a molybdenum film/an aluminum film, etc.

<Step of Forming First Interlayer Insulating Film>

An inorganic insulating film, such as a silicon oxide film (having a thickness of about 50 nm to 300 nm) is formed by, for example, plasma CVD on the entire substrate on which the source electrode 16ca and the drain electrode 16cb are formed in the step of forming the source/drain electrodes, thereby forming a first interlayer insulating film 17c.

<Annealing Step>

The substrate on which the first interlayer insulating film 17c is formed in the step of forming the first interlayer insulating film is heated at a temperature of about 300° C. to 400° C., thereby improving characteristics of the semiconductor layer 13c, and reducing the semiconductor layer 13c in contact with the metal layers 15ca and 15cb, to form a conductive region E in the semiconductor layer 13c.

<Step of Forming Second Interlayer Insulating Film>

First, a photosensitive acrylic resin is applied in a thickness of about 2 μm by, for example, spin coating or slit coating, on the entire substrate in which the conductive regions E are formed in the annealing step. The applied film is subjected to exposure, development and baking, thereby forming a second interlayer insulating film 18c having a contact hole.

Subsequently, the first interlayer insulating film 17c exposed from the second interlayer insulating film 18c is subjected to wet etching or dry etching, thereby forming a contact hole in the first interlayer insulating film 17c.

<Step of Forming Pixel Electrode>

A transparent conductive film (having a thickness of about 100 nm), such as an ITO film and an IZO film, is formed by, for example, sputtering on the entire substrate on which the second interlayer insulating film 18c is formed in the step of forming the second interlayer insulating film. After that, the transparent conductive film is subjected to photolithography, wet etching or dry etching, and resist removal and cleaning, thereby forming a pixel electrode 19a.

The TFT substrate 30c of the present embodiment can be obtained by the method described above.

As described above, according to the TFTs 5c, the TFT substrate 30c including the TFTs 5c, and a method for fabricating the TFT substrate 30c of the present embodiment, the metal layers 15ca and 15cb which are more easily reduced than the semiconductor layer 13c made of an oxide semiconductor are formed between the semiconductor layer 13c, and the source electrode 16ca and the drain electrode 16cb, in the step of forming the source/drain electrodes, and the conductive regions E reduced by the contact with the metal layers 15ca and 15cb is formed in the semiconductor layer 13c in the annealing step. It is therefore possible to reduce the contact resistance between the semiconductor layer 13c, and the source electrode 16ca and the drain electrode 16cb. Further, in the step of forming the semiconductor layer, the semiconductor layer 13c is provided with the channel protection film 14c which is a diffusion reducing portion for reducing diffusion of the conductive region E into the channel region C. Therefore, conduction of the channel region C of the semiconductor layer 13c is reduced, and it is possible to reduce short circuits of the source electrode 16ca and the drain electrode 16cb. By forming the conductive region E and the channel protection film 14c as a diffusion reducing portion in the semiconductor layer 13c, it is possible to reduce the contact resistance between the semiconductor layer 13c made of an oxide semiconductor, and the source electrode 16ca and the drain electrode 16cb, and possible to reduce short circuits of the source electrode 16ca and the drain electrode 16cb.

<<Fourth Embodiment of Invention>>

Figure 13:
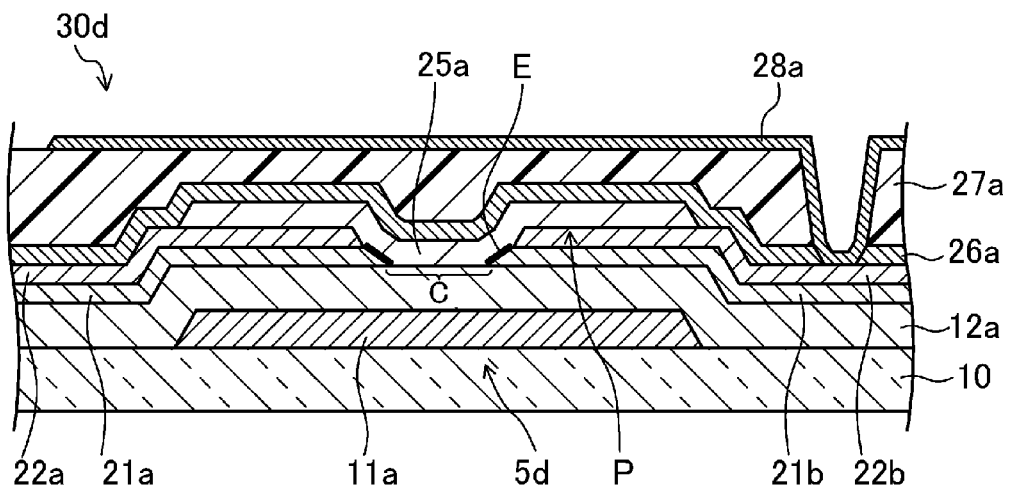
FIG. 13 is a cross-sectional view of a TFT substrate of the fourth embodiment.

FIG. 13 is a cross-sectional view of a TFT substrate 30d of the present embodiment.

The above embodiments illustrate the TFT substrates 30a-30c and methods for fabricating the TFT substrates 30a-30c including the TFTs 5a-5c in which the source electrode and the drain electrode are provided above the semiconductor layer. The present embodiment illustrates a TFT substrate 30d and a method for fabricating the TFT substrate 30d in which a source electrode and a drain electrode are provided under a semiconductor layer.

As shown in FIG. 13, the TFT substrate 30d includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5d each of which is provided for an intersection of the gate line 11a and the source line (16a), that is, provided for each of sub-pixels; a first interlayer insulating film 26a as an upper protection film which covers the TFTs 5d; a second interlayer insulating film 27a covering the first interlayer insulating film 26a; a plurality of pixel electrodes 28a provided in a matrix on the second interlayer insulating film 27a; and an alignment film (not shown) covering the pixel electrodes 28a. Similar to the TFT substrate 30a of the first embodiment, the TFT substrate 30d forms a liquid crystal display panel (50) together with a counter substrate (40), a liquid crystal layer (45) and a sealing material (46).

As shown in FIG. 13, each of the TFTs 5d includes: a gate electrode (11a) provided on the insulating substrate 10; a gate insulating film 12a covering the gate electrode (11a); a source electrode 22a and a drain electrode 22b formed on the gate insulating film 12a via metal layers 21a and 21b, respectively, overlapping the gate electrode (11a), and spaced apart from each other; and a semiconductor layer 25a provided on the source electrode 22a and the drain electrode 22b, and having a channel region C between the source electrode 22a and the drain electrode 22b.

The metal layers 21a and 21b are made, for example, of titanium and molybdenum, which are more easily reduced than the semiconductor layer 25a, and as shown in FIG. 13, the metal layers 21a and 21b are in contact with part of a bottom surface of the semiconductor layer 25a.

The source electrode 22a is an L-shaped laterally protruding portion of each of the source lines (16a, see FIG. 2) for each sub-pixel, for example.

As shown in FIG. 13, the drain electrode 22b is connected to the pixel electrode 28a via a contact hole formed in the multilayer film of the first interlayer insulating film 26a and the second interlayer insulating film 27a. Further, the drain electrode 22b is provided so as to overlap the capacitor line (11b, see FIG. 2) in each sub-pixel.

The side wall of the peripheral portion of each of the metal layers 21a and 21b, the source electrode 22a, and the drain electrode 22b is tilted in a forward tapered shape such that a portion closer to the gate insulating film 12a protrudes as shown in FIG. 13. The tilt angle of the side surface of the peripheral portion of each of the metal layers 21a and 21b is 10° to 60°, which is smaller than the tilt angle of the side surface of the peripheral portion of each of the source electrodes 22a and the drain electrode 22b.

The semiconductor layer 25a is made, for example, of an In—Ga—Zn—O-based oxide semiconductor. As shown in FIG. 13, the semiconductor layer 25a includes a separation portion P so that a region outside the channel region C is separated from the gate insulating film 12a. Further, the semiconductor layer 25a includes a conductive region E, which is reduced by contact with the metal layers 21a and 21b, at part of the bottom surface of the separation portion P as shown in FIG. 13. The separation portion P is provided to reduce the contact area between the semiconductor layer 25a and the metal layers 21a and 21b, as a diffusion reducing portion for reducing diffusion of the conductive region E into the channel region C.

Next, a method for fabricating the TFT substrate 30d of the present embodiment will be described using FIG. 13. The fabrication method of the present embodiment includes a step of forming a gate electrode, a step of forming a gate insulating film, a step of forming source/drain electrodes, a step of forming a semiconductor layer, a step of forming a first interlayer insulating film, an annealing step, a step of forming a second interlayer insulating film, and a step of forming a pixel electrode.

<Step of Forming Gate Electrode>

A titanium film (having a thickness of about 20 nm to 50 nm) and a copper film (having a thickness of about 100 nm to 400 nm), etc., are sequentially formed on the entire insulating substrate 10, such as a glass substrate, by sputtering, for example. After that, the multilayer metal film is subjected to photolithography, wet etching or dry etching, and resist removal and cleaning, thereby forming a gate electrode (11a).

<Step of Forming Gate Insulating Film>

A silicon nitride film (having a thickness of about 200 nm to 400 nm) and a silicon oxide film (having a thickness of about 10 nm to 100 nm), etc., are sequentially formed by, for example, plasma CVD on the entire substrate on which the gate electrode (11a) is formed in the step of forming the gate electrode, thereby forming a gate insulating film 12a.

<Step of Forming Source/Drain Electrodes>

A titanium film (having a thickness of about 20 nm to 50 nm) and a copper film (having a thickness of about 100 nm to 400 nm), etc., are sequentially formed by, for example, sputtering on the entire substrate on which the gate insulating film 12a is formed in the step of forming the gate insulating film. After that, the multilayer metal film is subjected to photolithography, wet etching or dry etching, and resist removal and cleaning, thereby forming metal layers 21a and 21b from the titanium film, and a source electrode 22a and a drain electrode 22b from the copper film. In the present embodiment, a titanium film is used as a metal film for forming the metal layers 21a and 21b, but the metal film may also be a molybdenum film, etc. Further, a copper film is used as a metal film for forming the source electrode 22a and the drain electrode 22b, but the metal film may also be an aluminum film, a multilayer film of a titanium film/an aluminum film, a multilayer film of a molybdenum film/an aluminum film, etc.

<Step of Forming Semiconductor Layer>

First, an In—Ga—Zn—O-based oxide semiconductor film (having a thickness of about 20 nm to 100 nm) is formed by sputtering on the entire substrate on which the source electrode 22a and the drain electrode 22b are formed in the step of forming the source/drain electrodes. The oxide semiconductor film is subjected to photolithography, wet etching using oxalic acid, and resist removal and cleaning, thereby forming a semiconductor layer 25a.

<Step of Forming First Interlayer Insulating Film>

An inorganic insulating film, such as a silicon oxide film (having a thickness of about 50 nm to 300 nm) is formed by, for example, plasma CVD on the entire substrate on which the semiconductor layer 25a is formed in the step of forming the semiconductor layer, thereby forming a first interlayer insulating film 26a.

<Annealing Step>

The substrate on which the first interlayer insulating film 26a is formed in the step of forming the first interlayer insulating film is heated at a temperature of about 300° C. to 400° C., thereby improving characteristics of the semiconductor layer 25a, and reducing the semiconductor layer 25a which is in contact with the metal layers 21a and 21b, to form a conductive region E in the semiconductor layer 25a.

<Step of Forming Second Interlayer Insulating Film>

First, a photosensitive acrylic resin is applied in a thickness of about 2 μm by, for example, spin coating or slit coating, on the entire substrate in which the conductive region E is formed in the annealing step. The applied film is subjected to exposure, development and baking, thereby forming a second interlayer insulating film 27a having a contact hole.

Subsequently, the first interlayer insulating film 26a exposed from the second interlayer insulating film 27a is subjected to wet etching or dry etching, thereby forming a contact hole in the first interlayer insulating film 26a.

<Step of Forming Pixel Electrode>

A transparent conductive film (having a thickness of about 100 nm), such as an ITO film and an IZO film is formed by, for example, sputtering on the entire substrate on which the second interlayer insulating film 27a is formed in the step of forming the second interlayer insulating film. After that, the transparent conductive film is subjected to photolithography, wet etching or dry etching, and resist removal and cleaning, thereby forming a pixel electrode 28a.

The TFT substrate 30d of the present embodiment can be obtained by the method described above.

As described above, according to the TFTs 5d, the TFT substrate 30d including the TFTs 5d, and a method for fabricating the TFT substrate 30d of the present embodiment, the source electrode 22a and the drain electrode 22b are formed on the gate insulating film 12a via the metal layers 21a and 21b, which are more easily reduced than an oxide semiconductor, in the step of forming the source/drain electrodes. In the step of forming the semiconductor layer, the semiconductor layer 25a made of an oxide semiconductor and having a channel region C between the source electrode 22a and the drain electrode 22b is formed. In the annealing step, the conductive regions E reduced by the contact with the metal layers 21a and 21b is formed in the semiconductor layer 25a. It is therefore possible to reduce the contact resistance between the semiconductor layer 25a, and the source electrode 22a and the drain electrode 22b. Further, in the step of forming the semiconductor layer, the separation portions P as diffusion reducing portions for reducing diffusion of the conductive region E into the channel region C are formed in the semiconductor layer 25a to be in contact with the side surfaces of the metal layers 21a and 21b. Thus, conduction of the channel region C of the semiconductor layer 25a is reduced, and it is possible to reduce short circuits of the source electrode 22a and the drain electrode 22b. By forming the conductive regions E and the separation portions P as diffusion reducing portions in the semiconductor layer 25a, it is possible to reduce the contact resistance between the semiconductor layer 25a made of an oxide semiconductor, and the source electrode 22a and the drain electrode 22b, and possible to reduce short circuits of the source electrode 22a and the drain electrode 22b.

According to the TFTs 5d, the TFT substrate 30d including the TFTs 5d, and a method for fabricating the TFT substrate 30d of the present embodiment, the step of forming the semiconductor layer is performed after the step of forming the source/drain electrodes. Thus, it is possible to obtain the semiconductor layer 25a less affected by damage and reaction products from etching.

According to the TFTs 5d, the TFT substrate 30d including the TFTs 5d, and a method for fabricating the TFT substrate 30d of the present embodiment, the first interlayer insulating film 26a as an upper protection film covers the semiconductor layer 25a. Thus, reliability of the back channel interface of the semiconductor layer 25a can be improved.

<<Fifth Embodiment of Invention>>

Figure 14:
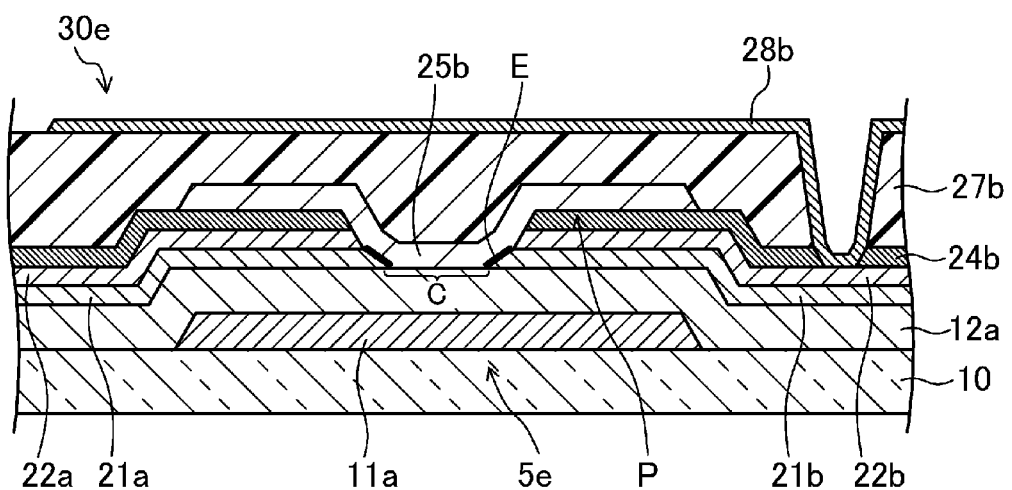
FIG. 14 is a cross-sectional view of a TFT substrate of the fifth embodiment.

FIG. 14 is a cross-sectional view of a TFT substrate 30e of the present embodiment.

The fourth embodiment illustrates the TFT substrate 30d and a method for fabricating the TFT substrate 30d including the TFTs 5d in which the semiconductor layer 25a is in contact with the upper surfaces and the side surfaces of the source electrode 22a and the drain electrode 22b. The present embodiment illustrates a TFT substrate 30e and a method for fabricating the TFT substrate 30e including TFTs 5e in which a semiconductor layer 25b is in contact with only side surfaces of a source electrode 22a and a drain electrode 22b.

As shown in FIG. 14, the TFT substrate 30e includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5e each of which is provided for an intersection of the gate line 11a and the source line (16a), that is, provided for each sub-pixel; an interlayer insulating film 27b covering the TFTs 5e; a plurality of pixel electrodes 28b provided in a matrix on the interlayer insulating film 27b; and an alignment film (not shown) covering the pixel electrodes 28b. Similar to the TFT substrate 30a of the first embodiment, the TFT substrate 30e forms a liquid crystal display panel (50) together with a counter substrate (40), a liquid crystal layer (45) and a sealing material (46).

As shown in FIG. 14, each of the TFTs 5e includes: a gate electrode (11a) provided on the insulating substrate 10; a gate insulating film 12a covering the gate electrode (11a); a source electrode 22a and a drain electrode 22b formed on the gate insulating film 12a via metal layers 21a and 21b, respectively, overlapping the gate electrode (11a), and spaced apart from each other; a lower protection film 24b covering upper surfaces of the source electrode 22a and the drain electrode 22b and exposing side surfaces of the source electrode 22a and the drain electrode 22b; and a semiconductor layer 25b provided on the lower protection film 24b and having a channel region C between the source electrode 22a and the drain electrode 22b.

The semiconductor layer 25b is made, for example, of an In—Ga—Zn—O-based oxide semiconductor. As shown in FIG. 14, the semiconductor layer 25b includes a separation portion P so that a region outside the channel region C is separated from the gate insulating film 12a. Further, the semiconductor layer 25b includes a conductive region E, which is reduced by contact with the metal layers 21a and 21b, at part of the bottom surface of the separation portion P as shown in FIG. 14. Further, as shown in FIG. 14, the semiconductor layer 25b is in contact with only the side surfaces of the source electrode 22a and the drain electrode 22b which are not covered by the lower protection film 24b. The separation portion P is provided to reduce the contact area between the semiconductor layer 25b and the metal layers 21a and 21b, as a diffusion reducing portion for reducing diffusion of the conductive region E into the channel region C.

Next, a method for fabricating the TFT substrate 30e of the present embodiment will be described using FIG. 14. The fabrication method of the present embodiment includes a step of forming a gate electrode, a step of forming a gate insulating film, a step of forming source/drain electrodes, a step of forming a lower protection film, a step of forming a semiconductor layer, an annealing step, a step of forming an interlayer insulating film, and a step of forming a pixel electrode. Here, the step of forming the gate electrode, the step of forming the gate insulating film, and the step of forming the source/drain electrodes of the present embodiment are substantially the same as the step of forming the gate electrode, the step of forming the gate insulating film, and the step of forming the source/drain electrodes of the fourth embodiment. Thus, in the present embodiment, the descriptions of these steps are omitted and the step of forming a lower protection film and its subsequent steps will be described.

<Step of Forming Lower Protection Film>

An inorganic insulating film, such as a silicon oxide film (having a thickness of about 50 nm to 300 nm) is formed by, for example, plasma CVD on the entire substrate on which the source electrode 22a and the drain electrode 22b are formed in the step of forming the source/drain electrodes of the fourth embodiment, thereby forming a lower protection film 24b.

<Step of Forming Semiconductor Layer>

An In—Ga—Zn—O-based oxide semiconductor film (having a thickness of about 20 nm to 100 nm) is formed by sputtering on the entire substrate on which the lower protection film 24b is formed in the step of forming the lower protection film. The oxide semiconductor film is subjected to photolithography, wet etching using oxalic acid, and resist removal and cleaning, thereby forming a semiconductor layer 25b.

\<Annealing Step\>

The substrate on which the semiconductor layer 25b is formed in the step of forming the semiconductor layer is heated at a temperature of about 300° C. to 400° C., thereby improving characteristics of the semiconductor layer 25b, and reducing the semiconductor layer 25b in contact with the metal layers 21a and 21b, to form conductive regions E in the semiconductor layer 25b.

\<Step of Forming Interlayer Insulating Film\>

First, a photosensitive acrylic resin is applied in a thickness of about 2 μm by, for example, spin coating or slit coating, on the entire substrate in which the conductive regions E are formed in the annealing step. The applied film is subjected to exposure, development and baking, thereby forming an interlayer insulating film 27b having a contact hole.

Subsequently, the lower protection film 24b exposed from the interlayer insulating film 27b is subjected to wet etching or dry etching, thereby forming a contact hole in the lower protection film 24b.

\<Step of Forming Pixel Electrode\>

A transparent conductive film (having a thickness of about 100 nm), such as an ITO film and an IZO film is formed by, for example, sputtering on the entire substrate on which the interlayer insulating film 27b is formed in the step of forming the interlayer insulating film. After that, the transparent conductive film is subjected to photolithography, wet etching or dry etching, and resist removal and cleaning, thereby forming a pixel electrode 28b.

The TFT substrate 30e of the present embodiment can be obtained by the method described above.

As described above, according to the TFTs 5e, the TFT substrate 30e including the TFTs 5e, and a method for fabricating the TFT substrate 30e of the present embodiment, similar to the fourth embodiment, it is possible to reduce the contact resistance between the semiconductor layer 25b made of an oxide semiconductor, and the source electrode 22a and the drain electrode 22b, and possible to reduce short circuits of the source electrode 22a and the drain electrode 22b, by forming the conductive region E and the separation portion P as a diffusion reducing portion in the semiconductor layer 25b.

According to the TFTs 5e, the TFT substrate 30e, and a method for fabricating the TFT substrate 30e of the present embodiment, the step of forming the semiconductor layer is performed after the step of forming the source/drain electrodes, similar to the fourth embodiment. Thus, it is possible to obtain the semiconductor layer 25b less affected by damage and reaction products from etching.

According to the TFTs 5e, the TFT substrate 30e, and a method for fabricating the TFT substrate 30e of the present embodiment, the semiconductor layer 25b is in contact with only the side surface of each of the source electrode 22a and the drain electrode 22b, and thus, contamination of the semiconductor layer 25b with metals, e.g., copper and aluminum, is reduced.

\<\<\<Sixth Embodiment of Invention\>\>

Figure 15:
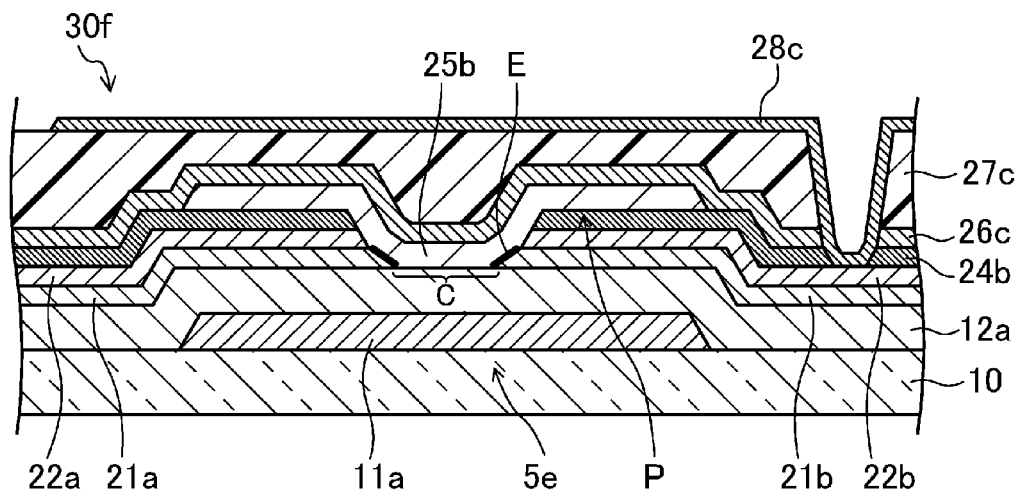
FIG. 15 is a cross-sectional view of a TFT substrate of the sixth embodiment.

FIG. 15 is a cross-sectional view of a TFT substrate 30f of the present embodiment.

The fifth embodiment illustrates the TFT substrate 30e and a method for fabricating the TFT substrate 30e including the TFTs 5e in which an organic insulating film is formed on the semiconductor layer 25b. In the present embodiment, a TFT substrate 30f and a method for fabricating the TFT substrate 30f including TFTs 5e in which an inorganic insulating film is formed on the semiconductor layer 25b will be illustrated.

As shown in FIG. 15, the TFT substrate 30f includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5e each of which is provided for an intersection of the gate line 11a and the source line (16a), that is, provided for each sub-pixel; a first interlayer insulating film 26c as an upper protection film covering the TFTs 5e; a second interlayer insulating film 27c covering the first interlayer insulating film 26c; a plurality of pixel electrodes 28c provided in a matrix on the second interlayer insulating film 27c; and an alignment film (not shown) covering the pixel electrodes 28c. Similar to the TFT substrate 30a of the first embodiment, the TFT substrate 30f forms a liquid crystal display panel (50) together with a counter substrate (40), a liquid crystal layer (45) and a sealing material (46).

Next, a method for fabricating the TFT substrate 30f of the present embodiment will be described using FIG. 15. The fabrication method of the present embodiment includes a step of forming a gate electrode, a step of forming a gate insulating film, a step of forming source/drain electrodes, a step of forming a lower protection film, a step of forming a semiconductor layer, a step of forming a first interlayer insulating film, an annealing step, a step of forming a second interlayer insulating film, and a step of forming a pixel electrode. Here, the step of forming the gate electrode, the step of forming the gate insulating film, the step of forming the source/drain electrodes, the step of forming the lower protection film, and the step of forming the semiconductor layer of the present embodiment are substantially the same as the step of forming the gate electrode, the step of forming the gate insulating film, the step of forming the source/drain electrodes, the step of forming the lower protection film, and the step of forming the semiconductor layer of the fifth embodiment. Thus, in the present embodiment, the descriptions of these steps are omitted and the step of forming a first interlayer insulating film and its subsequent steps will be described.

\<Step of Forming First Interlayer Insulating Film\>

An inorganic insulating film, such as a silicon oxide film (having a thickness of about 50 nm to 300 nm) is formed by, for example, plasma CVD on the entire substrate on which the semiconductor layer 25b is formed in the step of forming the semiconductor layer of the fifth embodiment, thereby forming a first interlayer insulating film 26c.

\<Annealing Step\>

The substrate on which the first interlayer insulating film 26c is formed in the step of forming the first interlayer insulating film is heated at a temperature of about 300° C. to 400° C., thereby improving characteristics of the semiconductor layer 25b, and reducing the semiconductor layer 25b which is in contact with metal layers 21a and 21b, to form a conductive region E in the semiconductor layer 25b.

\<Step of Forming Second Interlayer Insulating Film\>

First, a photosensitive acrylic resin is applied in a thickness of about 2 μm by, for example, spin coating or slit coating, on the entire substrate in which the conductive region E is formed in the annealing step. The applied film is subjected to exposure, development and baking, thereby forming a second interlayer insulating film 27c having a contact hole.

Subsequently, the multilayer film of the lower protection film 24b and the first interlayer insulating film 26c which are exposed from the second interlayer insulating film 27c is subjected to wet etching or dry etching, thereby forming a contact hole in the multilayer film of the lower protection film 24b and the first interlayer insulating film 26c.

<Step of Forming Pixel Electrode>

A transparent conductive film (having a thickness of about 100 nm), such as an ITO film and an IZO film is formed by, for example, sputtering on the entire substrate on which the second interlayer insulating film 27c is formed in the step of forming the interlayer insulating film. After that, the transparent conductive film is subjected to photolithography, wet etching or dry etching, and resist removal and cleaning, thereby forming a pixel electrode 28c.

The TFT substrate 30f of the present embodiment can be obtained by the method described above.

As described above, according to the TFTs 5e, the TFT substrate 30f including the TFTs 5e, and a method for fabricating the TFT substrate 30f of the present embodiment, similar to the fourth and fifth embodiments, it is possible to reduce the contact resistance between the semiconductor layer 25b made of an oxide semiconductor, and the source electrode 22a and the drain electrode 22b, and possible to reduce short circuits of the source electrode 22a and the drain electrode 22b, by forming the conductive region E and the separation portion P as a diffusion reducing portion in the semiconductor layer 25b.

According to the TFTs 5e, the TFT substrate 30f including the TFTs 5e, and a method for fabricating the TFT substrate 30f of the present embodiment, similar to the fourth and fifth embodiments, the step of forming the semiconductor layer is performed after the step of forming the source/drain electrodes. Thus, it is possible to obtain the semiconductor layer 25b less affected by damage and reaction products from etching.

According to the TFTs 5e, the TFT substrate 30f including the TFTs 5e, and a method for fabricating the TFT substrate 30f of the present embodiment, similar to the fifth embodiment, the semiconductor layer 25b is in contact with only the side surface of each of the source electrode 22a and the drain electrode 22b, and thus, contamination of the semiconductor layer 25b with metals, e.g., copper and aluminum, is reduced.

According to the TFTs 5e, the TFT substrate 30f including the TFTs 5e, and a method for fabricating the TFT substrate 30f of the present embodiment, similar to the fourth embodiment, the first interlayer insulating film 26c as an upper protection film covers the semiconductor layer 25b. Thus, reliability of the back channel interface of the semiconductor layer 25b can be improved.

<<Seventh Embodiment of Invention>>

Figure 16:
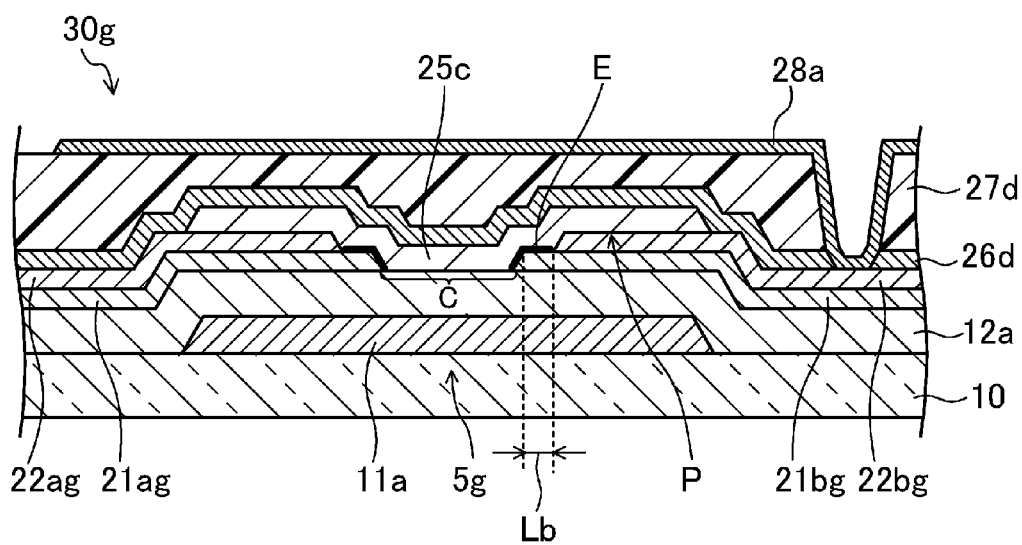
FIG. 16 is a cross-sectional view of a TFT substrate of the seventh embodiment.

FIG. 16 is a cross-sectional view of a TFT substrate 30g of the present embodiment.

The fourth to sixth embodiments illustrate the TFT substrates 30d-30f and methods for fabricating the TFT substrates 30d-30f including TFTs in which the side surfaces of the peripheral portions of the metal layers 21a and 21b and the side surfaces of the peripheral portions of the are continuous source electrode 22a and the drain electrode 22b are continuous. The present embodiment illustrates a TFT substrate 30g and a method for fabricating the TFT substrate 30g including TFTs 5g in which side surfaces of the peripheral portions of metal layers 21ag and 21bg and side surfaces of the peripheral portions of a source electrode 22ag and a drain electrode 22bg are not continuous.

As shown in FIG. 16, the TFT substrate 30g includes: an insulating substrate 10; a plurality of gate lines 11a provided on the insulating substrate 10 so as to extend in parallel to each other; a plurality of capacitor lines (11b) each provided between the gate lines 11a so as to extend in parallel to each other; a plurality of source lines (16a) extending in parallel to each other in a direction orthogonal to the gate lines 11a; a plurality of TFTs 5g each of which is provided for an intersection of the gate line 11a and the source line (16a), that is, provided for each sub-pixel; a first interlayer insulating film 26d covering the TFTs 5g; a second interlayer insulating film 27d covering the first interlayer insulating film 26d; a plurality of pixel electrodes 28a provided in a matrix on the second interlayer insulating film 27d; and an alignment film (not shown) covering the pixel electrodes 28a. Similar to the TFT substrate 30a of the first embodiment, the TFT substrate 30g forms a liquid crystal display panel (50) together with a counter substrate (40), a liquid crystal layer (45) and a sealing material (46).

As shown in FIG. 16, each of the TFTs 5g includes: a gate electrode (11a) provided on the insulating substrate 10; a gate insulating film 12a covering the gate electrode (11a); a source electrode 22ag and a drain electrode 22bg formed on the gate insulating film 12a via metal layers 21ag and 21bg, respectively, overlapping the gate electrode (11a), and spaced apart from each other; and a semiconductor layer 25c provided on the source electrode 22ag and the drain electrode 22bg and having a channel region C between the source electrode 22ag and the drain electrode 22bg.

The metal layers 21ag and 21bg are made, for example, of titanium and molybdenum, which are more easily reduced than the semiconductor layer 25c, and as shown in FIG. 16, the metal layers 21ag and 21bg are in contact with part of a bottom surface of the semiconductor layer 25c.

The source electrode 22ag is an L-shaped laterally protruding portion of each of the source lines (16a, see FIG. 2) for each sub-pixel, for example.

As shown in FIG. 16, the drain electrode 22bg is connected to the pixel electrode 28a via a contact hole formed in the multilayer film of the first interlayer insulating film 26d and the second interlayer insulating film 27d. Further, the drain electrode 22bg is provided so as to overlap the capacitor line (11b, see FIG. 2) in each sub-pixel.

The side surface of the peripheral portion of each of the metal layers 21ag and 21bg, the source electrode 22ag, and the drain electrode 22bg is tilted in a forward tapered shape such that a portion closer to the gate insulating film 12a protrudes as shown in FIG. 16. The peripheral portion of each of the metal layers 21ag and 21bg protrudes more than the peripheral portion of each of the source electrode 22ag and the drain electrode 22bg. The length Lb (see FIG. 16) of the peripheral portion of each of the metal layers 21ag and 21bg which protrudes from the peripheral portion of each of the source electrode 22ag and the drain electrode 22bg is 0.05 µm to 0.5 µm. If the length Lb is less than 0.05 µm, the contact characteristics are equivalent to the contact characteristics of the TFT substrate 30d of the fourth embodiment. If the length Lb is greater than 0.5 µm, the source electrode 22ag and the drain electrode 22bg may be short-circuited.

The semiconductor layer 25c is made, for example, of an In—Ga—Zn—O-based oxide semiconductor. As shown in FIG. 16, the semiconductor layer 25c includes a separation portion P so that a region outside the channel region C is separated from the gate insulating film 12a. Further, the semiconductor layer 25a includes a conductive region E, which is reduced by contact with the metal layers 21ag and 21bg, at part of the bottom surface of the separation portion P as shown in FIG. 16. The separation portion P is provided to reduce the contact area between the semiconductor layer 25c and the metal layers 21ag and 21bg, as a diffusion reducing portion for reducing diffusion of the conductive region E into the channel region C.

In fabricating the TFT substrate 30g, a titanium film and a copper film are sequentially deposited to form a multilayer metal film in the step of forming source/drain electrodes of the fourth embodiment. The multilayer metal film is subjected to photolithography; the copper film as an upper layer is subjected to wet etching using a mixed acid of hydrogen peroxide; the titanium film as a lower layer is subjected to dry etching, and the multilayer metal film is subjected to resist removal and cleaning, thereby forming metal layers 21*ag* and 21*bg*, a source electrode 22*ag*, and a drain electrode 22*bg*. After that, a semiconductor layer 25*c*, a first interlayer insulating film 26*d*, a second interlayer insulating film 27*d*, and a pixel electrode 28*a* are appropriately formed to obtain the TFT substrate 30*g*. In the present embodiment, a copper film is used to form the source electrode 22*ag* and the drain electrode 22*bg*. In the case of using an aluminum film to form the source electrode 22*ag* and the drain electrode 22*bg*, the aluminum film may be subjected to wet etching using a mixed acid of phosphoric acid, acetic acid and nitric acid.

As described above, according to the TFTs 5*g*, the TFT substrate 30*g* including the TFTs 5*g*, and a method for fabricating the TFT substrate 30*g* of the present embodiment, the semiconductor layer 25*c* is provided with the conductive region E, and the separation portion P as a diffusion reducing portion, similar to the fourth to sixth embodiments. It is thus possible to reduce the contact resistance between the semiconductor layer 25*c* made of an oxide semiconductor, and the source electrode 22*ag* and the drain electrode 22*bg*, and also possible to reduce short circuits of the source electrode 22*ag* and the drain electrode 22*bg*.

According to the TFTs 5*g*, the TFT substrate 30*g* including the TFTs 5*g*, and a method for fabricating the TFT substrate 30*g* of the present embodiment, the step of forming the semiconductor layer is performed after the step of forming the source/drain electrodes, similar to the fourth to sixth embodiments. Thus, it is possible to obtain the semiconductor layer 25*c* less affected by damage and reaction products from etching.

According to the TFTs 5*g*, the TFT substrate 30*g* including the TFTs 5*g*, and a method for fabricating the TFT substrate 30*g* of the present embodiment, the first interlayer insulating film 26*d* as an upper protection film covers the semiconductor layer 25*c*. Thus, reliability of the back channel interface of the semiconductor layer 25*c* can be improved.

According to the TFTs 5*g*, the TFT substrate 30*g* including the TFTs 5*g*, and a method for fabricating the TFT substrate 30*g* of the present embodiment, the source electrode 22*ag* and the drain electrode 22*bg* are formed by wet etching in the step of forming the source/drain electrodes, and therefore, the side surface of the peripheral portion of each of the source electrode 22*ag* and the drain electrode 22*bg* is tilted such that a portion closer to the gate insulating film 12*a* protrudes. After that, the metal layers 21*ag* and 2 lbg are formed by dry etching to protrude more than the source electrode 22*ag* and the drain electrode 22*bg*. As a result, the peripheral portion of the multilayered structure of the metal layers 21*ag* and 21*bg* and the source electrode 22*ag* and the drain electrode 22*bg* has a stepped structure. This structure increases the contact area between the semiconductor layer 25*c* and the metal layers 21*ag* and 21*bg*, and therefore, desired contact characteristics between the semiconductor layer 25*c* and the metal layers 21*ag* and 21*bg* can be easily achieved.

<<Eighth Embodiment of Invention>>

Figure 17:
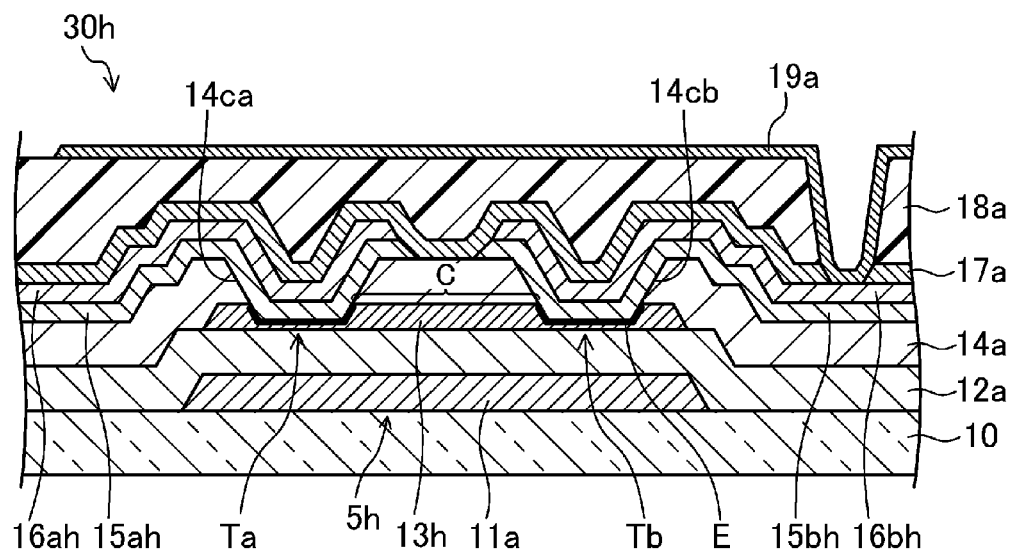
FIG. 17 is a cross-sectional view of a TFT substrate of the eighth embodiment.

FIG. 17 is a cross-sectional view of a TFT substrate 30*h* of the present embodiment.

The above embodiments illustrate the TFT substrates 30*a*-30*g* and methods for fabricating the TFT substrates 30*a*-30*g* including TFTs in which a diffusion reducing portion is configured to reduce the contact area between the semiconductor layer and the metal layers. On the other hand, in the present embodiment, a TFT substrate 30*h* and a method for fabricating the TFT substrate 30*h* including TFTs 5*h* in which a diffusion reducing portion is configured to reduce a thickness of a semiconductor layer 13*h* at a conductive region E.

As shown in FIG. 17, the TFT substrate 30*h* includes: an insulating substrate 10; a plurality of gate lines 11*a* provided on the insulating substrate 10 so as to extend in parallel to each other; a plurality of capacitor lines (11*b*) each provided between the gate lines 11*a* so as to extend in parallel to each other; a plurality of source lines (16*a*) extending in parallel to each other in a direction orthogonal to the gate lines 11*a*; a plurality of TFTs 5*h* each of which is provided for an intersection of the gate line IIa and the source line (16*a*), that is, provided for each of sub-pixels; a first interlayer insulating film 17*a* covering each of the TFTs 5*h*; a second interlayer insulating film 18*a* covering the first interlayer insulating film 17*a*; a plurality of pixel electrodes 19*a* provided in a matrix on the second interlayer insulating film 18*a*; and an alignment film (not shown) covering the pixel electrodes 19*a*. Similar to the TFT substrate 30*a* of the first embodiment, the TFT substrate 30*h* forms a liquid crystal display panel (50) together with a counter substrate (40), a liquid crystal layer (45) and a sealing material (46).

As shown in FIG. 17, each of the TFTs 5*h* includes: a gate electrode (11*a*) provided on the insulating substrate 10; a gate insulating film 12*a* covering the gate electrode (11*a*); a semiconductor layer 13*h* provided on the gate insulating film 12*a* and having a channel region C which overlaps the gate electrode (11*a*); and a source electrode 16*ah* and a drain electrode 16*bh* formed on the semiconductor layer 13*h* via metal layers 15*ah* and 15*bh*, respectively, and spaced apart from each other, with the channel region C interposed therebetween.

The semiconductor layer 13*h* is made, for example, of an In—Ga—Zn—O-based oxide semiconductor. Further, as shown in FIG. 17, the semiconductor layer 13*h* has a first reduced thickness portion Ta and a second reduced thickness portion Tb where the thicknesses are smaller than the thickness of a portion where the channel region C is formed. Here, the side wall of each of the first reduced thickness portion Ta and the second reduced thickness portion Tb is tilted in a forward tapered shape such that a portion closer to the gate insulating film 12*a* protrudes as shown in FIG. 17. The semiconductor layer 13*h* includes conductive regions E, which are reduced by contact with the metal layers 15*ah* and 15*bh*, on the side wall and the bottom of each of the first reduced thickness portion Ta and the second reduced thickness portion Tb, as shown in FIG. 17. The first reduced thickness portion Ta and the second reduced thickness portion Tb are configured to reduce the thickness of the semiconductor layer 13*h* at each conductive region E, to serve as diffusion reducing portions for reducing diffusion of the conductive regions E into the channel region C. Further, the thickness of the semiconductor layer 13*h* at the first reduced thickness portion Ta and the second reduced thickness portion Tb is $\frac{1}{10}$ to $\frac{1}{2}$ of the thickness of the semiconductor layer 13*h* where the channel region C is formed. If the thickness of the semiconductor layer 13*h* at the first reduced thickness portion Ta and the second reduced thickness portion Tb is less than $\frac{1}{10}$ of the thickness of the semiconductor layer 13*h* where the channel region C is formed, substantially the same effects as the effects of the TFT substrate 30*a* of the first embodiment can be obtained. If the thickness of the semiconductor layer 13*h* at the first reduced thickness portion Ta and the second reduced thickness portion Tb is greater than $\frac{1}{2}$ of the thickness of the semiconductor layer 13*h* where the channel region C is formed, the source electrode 16*ah* and the drain electrode 16*bh* may be short-circuited.

As shown in FIG. 17, a protection film 14h is provided between the semiconductor layer 13h and the metal layers 15ah and 15bh. As shown in FIG. 17, the protection film 14h is provided with a third opening 14ca which overlaps the first reduced thickness portion Ta and is larger (i.e., having a larger aperture) than the first reduced thickness portion Ta in plan view, and is provided with a fourth opening 14cb which overlaps the second reduced thickness portion Tb and is larger (i.e., having a larger aperture) than the second reduced thickness portion Tb in plan view. Each side wall of the third opening 14ca and the fourth opening 14cb is tilted in a forward tapered shape such that a portion closer to the semiconductor layer 13h protrudes as shown in FIG. 17. The side wall of the third opening 14ca and the side wall of the first reduced thickness portion Ta are continuous as shown in FIG. 17. The side wall of the fourth opening 14cb and the side wall of the second reduced thickness portion Tb are continuous as shown in FIG. 17.

The metal layers 15ah and 15bh are made, for example, of titanium and molybdenum, which are more easily reduced than the semiconductor layer 13h, and as shown in FIG. 17, the metal layers 15ah and 15bh are in contact with the semiconductor layer 13h via the side wall and the bottom of each of the first reduced thickness portion Ta and the second reduced thickness portion Tb.

The source electrode 16ah is an L-shaped laterally protruding portion of each of the source lines (16a, see FIG. 2) for each sub-pixel.

As shown in FIG. 17, the drain electrode 16bh is connected to the pixel electrode 19a via a contact hole formed in a multilayer film of the first interlayer insulating film 17a and the second interlayer insulating film 18a. Further, the drain electrode 16bh is provided so as to overlap the capacitor line (11b, see FIG. 2) in each sub-pixel.

The TFT substrate 30h can be fabricated as follows, that is, in the step of forming the semiconductor layer of the first embodiment, an inorganic insulating film such as a silicon oxide film is deposited by, for example, plasma CVD on the entire substrate on which the semiconductor layer formation layer 13ab is formed; after that, the inorganic insulating film is subjected to photolithography and dry etching using tetrafluoromethane gas/oxygen gas; the semiconductor layer formation layer 13ab is subjected to dry etching using chlorine gas/boron trichloride gas; and resist removal and cleaning are performed, wherein the time of dry etching of the semiconductor layer formation layer 13ab is reduced to form the semiconductor layer 13h and the protection film 14a.

As described above, according to the TFTs 5h, the TFT substrate 30h including the TFTs 5h, and a method for fabricating the TFT substrate 30h of the present embodiment, the metal layers 15ah and 15bh which are more easily reduced than the semiconductor layer 13h made of an oxide semiconductor are formed between the semiconductor layer 13h, and the source electrode 16ah and the drain electrode 16bh, in the step of forming the source/drain electrodes, and the conductive region E reduced by the contact with the metal layers 15ah and 15bh is formed in the semiconductor layer 13h in the annealing step. It is therefore possible to reduce the contact resistance between the semiconductor layer 13h, and the source electrode 16ah and the drain electrode 16bh. Further, in the step of forming the semiconductor layer, the semiconductor layer 13h is provided with the first reduced thickness portion Ta and the second reduced thickness portion Tb as diffusion reducing portions for reducing diffusion of the conductive region E into the channel region C, and the metal layers 15ah and 15bh formed in the step of forming the source/drain electrodes are in contact with the semiconductor layer 13h via the first reduced thickness portion Ta and the second reduced thickness portion Tb. Thus, even if the conductive region E is excessively formed in the semiconductor layer 13h due to a large contact area between the semiconductor layer 13h and the metal layers 15ah and 15bh, and the conductive region E is heated in the succeeding annealing step, diffusion of the conductive region E into the channel region C of the semiconductor layer 13h is reduced because the first reduced thickness portion Ta and the second reduced thickness portion Tb of the semiconductor layer 13h serve as bottlenecks. As a result, conduction of the channel region C of the semiconductor layer 13h is reduced, and it is thus possible to reduce short circuits of the source electrode 16ah and the drain electrode 16bh. By forming the conductive region E and the first reduced thickness portions Ta and Tb as diffusion reducing portions in the semiconductor layer 13h, it is possible to reduce the contact resistance between the semiconductor layer 13h made of an oxide semiconductor, and the source electrode 16ah and the drain electrode 16bh, and also possible to reduce short circuits of the source electrode 16ah and the drain electrode 16bh.

In the above embodiments, liquid crystal display panels have been illustrated as display panels, but the present disclosure is applicable to other display panels, such as organic electro luminescence (EL) panels.

In the above embodiments, TFT substrates in which a drain electrode of a TFT is connected to the pixel electrode have been illustrated, but the present disclosure is applicable to TFT substrates in which a source electrode of a TFT is connected to the pixel electrode.

In the above embodiments, TFTs provided for each sub-pixel have been illustrated as switching elements, but the present disclosure is applicable to electronic circuits, such as inverter circuits and shift register circuits. By forming these electronic circuits simultaneously with the TFTs for the respective sub-pixels, it is possible to reduce costs and achieve a narrower frame.

In the above embodiments, semiconductor layers made of an In—Ga—Zn—O-based oxide semiconductor have been illustrated, but the present disclosure is applicable to semiconductor layers made of, such as In—Si—Zn—O-based, In—Al—Zn—O-based, Sn—Si—Zn—O-based, Sn—Al—Zn—O-based, Sn—Ga—Zn—O-based, Ga—Si—Zn—O-based, Ga—Al—Zn—O-based, In—Cu—Zn—O-based, Sn—Cu—Zn—O-based, Zn—O-based, and In—O-based oxide semiconductors.

Industrial Applicability

As described above, according to the present disclosure, in a TFT using a semiconductor layer made of an oxide semiconductor, it is possible to reduce the contact resistance between the semiconductor layer, and a source electrode and a drain electrode, and possible to reduce short circuits of the source electrode and the drain electrode. Thus, the present disclosure is useful as a TFT substrate which comprises various display panels, such as a liquid crystal display panel and an organic EL display panel.

DESCRIPTION OF REFERENCE CHARACTERS

C channel region
E conductive region
P separation portion (diffusion reducing portion)
Ta first reduced thickness portion (diffusion reducing portion)
Tb second reduced thickness portion (diffusion reducing portion)
5a to 5e, 5g, 5h TFT 10 insulating substrate
11a gate electrode
12a gate insulating film
13a, 13c, 13h semiconductor layer
13ca first opening (diffusion reducing portion)
13cb second opening (diffusion reducing portion)
14a, 14b protection film
14ca, 14 cc third opening
14cb, 14cd fourth opening
14c channel protection film (diffusion reducing portion)
15aa, 15ab, 15ba, 15bb, 15ca, 15cb, 15ah, 15bh metal layer
16aa, 16ba, 16ca, 16ah source electrode
16ab, 16bb, 16cb, 16bh drain electrode
21a, 21ag, 21b, 21bg metal layer
22a, 22ag source electrode
22b, 22bg drain electrode
24b lower protection film
25a to 25c semiconductor layer
26a, 26c, 26d first interlayer insulating film (upper protection film)
30a to 30h TFT substrate
40 counter substrate
45 liquid crystal layer (display medium layer)
50 liquid crystal display panel

The invention claimed is:

1. A thin film transistor, comprising:
a gate electrode provided on a substrate;
a gate insulating film covering the gate electrode;
a semiconductor layer made of an oxide semiconductor provided on the gate insulating film, and having a channel region overlapping the gate electrode;
a source electrode and a drain electrode provided on the semiconductor layer via metal layers which are more easily reduced than the semiconductor layer, and spaced apart from each other, with the channel region interposed therebetween;
a conductive region provided on the semiconductor layer, and reduced by contact with the metal layers; and
a diffusion reducing portion provided in the semiconductor layer to limit an amount of diffusion of the conductive region into the channel region; wherein
the diffusion reducing portion is configured to reduce a contact area between the semiconductor layer and the metal layers;
the metal layers are provided on the semiconductor layer so as to be opposite to the substrate;
the semiconductor layer is provided with a first opening and a second opening which expose the gate insulating film from the semiconductor layer and each of which serves as the diffusion reducing portion;
the metal layers are in contact with the semiconductor layer via side walls of the first opening and the second opening; and
the first opening and the second opening are completely surrounded by the semiconductor layer when viewed from a top view.

2. The thin film transistor of claim 1, wherein
a protection film made of an inorganic insulating film is provided between the semiconductor layer and the metal layers,
the protection film is provided with a third opening which overlaps the first opening and is larger than the first opening in plan view, and is provided with a fourth opening which overlaps the second opening and is larger than the second opening in plan view, and the side wall of the first opening and a side wall of the third opening are continuous, and the side wall of the second opening and a side wall of the fourth opening are continuous.

3. The thin film transistor of claim 1, wherein
a protection film made of an inorganic insulating film is provided between the semiconductor layer and the metal layers,
the protection film is provided with a third opening which overlaps the first opening and is larger than the first opening in plan view, and is provided with a fourth opening which overlaps the second opening and is larger than the second opening in plan view, and
an edge of the first opening in the semiconductor layer is exposed from the third opening, and an edge of the second opening in the semiconductor layer is exposed from the fourth opening.

4. The thin film transistor of claim 1, wherein
the semiconductor layer includes a separation portion, which serves as the diffusion reducing portion, so that a region outside the channel region is separated from the gate insulating film,
the metal layers, the source electrode, and the drain electrode are provided between the gate insulating film and the separation portion of the semiconductor layer, and
the metal layers are in contact with the semiconductor layer via the separation portion.

5. The thin film transistor of claim 4, wherein
an upper protection film made of an inorganic insulating film is provided on the semiconductor layer to cover the semiconductor layer.

6. The thin film transistor of claim 4, wherein
a lower protection film made of an inorganic insulating film is provided between the separation portion of the semiconductor layer, and the source electrode and the drain electrode, to cover upper surfaces of the source electrode and the drain electrode.

7. The thin film transistor of claim 4, wherein
the source electrode and the drain electrode are provided on the metal layers, and
the metal layers protrude more than the source electrode and the drain electrode, at portions where the metal layers are in contact with the separation portion of the semiconductor layer.

8. The thin film transistor of claim 1, wherein
a channel protection film, which serves as the diffusion reducing portion, is provided on the semiconductor layer to cover an upper surface of the semiconductor layer but not cover a side surface of the semiconductor layer, and
the metal layers are in contact with the side surface of the semiconductor layer which is not covered by the channel protection film.

9. The thin film transistor of claim 1, wherein
the diffusion reducing portion is configured to reduce a thickness of the semiconductor layer at the conductive region.

10. The thin film transistor of claim 9, wherein
the semiconductor layer includes a first reduced thickness portion and a second reduced thickness portion, each corresponding to the conductive region, having a thickness smaller than a thickness of the semiconductor layer where the channel region is formed, and serving as the diffusion reducing portion, and
the metal layers are in contact with the semiconductor layer via the first reduced thickness portion and the second reduced thickness portion.

11. A display panel, comprising:
a thin film transistor substrate including the thin film transistor of claim 1;
a counter substrate located to face the thin film transistor substrate, and
a display medium layer provided between the thin film transistor substrate and the counter substrate.

12. A method for fabricating a thin film transistor, comprising:
a step of forming a gate electrode on a substrate;
a step of forming a gate insulating film to cover the gate electrode;
a step of forming a semiconductor layer made of an oxide semiconductor and having a channel region overlapping the gate electrode, on the gate insulating film;
a step of forming source/drain electrodes on the semiconductor layer via metal layers which are more easily reduced than the semiconductor layer, such that the source electrode and the drain electrode are spaced apart from each other, with the channel region interposed therebetween; and
an annealing step in which the substrate on which the source electrode and the drain electrode are formed is heated to reduce the semiconductor layer in contact with the metal layers, thereby forming a conductive region in the semiconductor layer, wherein
in the step of forming the semiconductor layer, a diffusion reducing portion to limit an amount of diffusion of the conductive region into the channel region is formed in the semiconductor layer;
in the step of forming the semiconductor layer, the diffusion reducing portion is formed to reduce a contact area between the semiconductor layer and the metal layers;
in the step of forming the semiconductor layer, the diffusion reducing portion is formed by forming a first opening and a second opening in the semiconductor layer to expose the gate insulating film; and
the first opening and the second opening are completely surrounded by the semiconductor layer when viewed from a top view.

13. The method of claim 12, wherein
in the step of forming the semiconductor layer, in forming the semiconductor layer, a channel protection film as the diffusion reducing portion is formed to cover an upper surface of the semiconductor layer but not cover a side surface of the semiconductor layer.

14. The method of claim 12, wherein
in the step of forming the semiconductor layer, the diffusion reducing portion is formed to reduce a thickness of the semiconductor layer at the conductive region.

15. The method of claim 14, wherein
in the step of forming the semiconductor layer, the diffusion reducing portion is formed by forming, in the semiconductor layer, a first reduced thickness portion and a second reduced thickness portion, each corresponding to the conductive region and having a thickness smaller than a thickness of the semiconductor layer where the channel region is formed.

* * * * *